US012666669B2

(12) United States Patent     (10) Patent No.:   US 12,666,669 B2
Wang et al.     (45) Date of Patent:    Jun. 23, 2026

(54) FIELD-EFFECT TRANSISTOR DEVICE WITH EQUIVALENT SOURCE AND DRAIN REGION OPTIMIZATION

(71) Applicant: Soochow University, Suzhou City (CN)

(72) Inventors: Mingxiang Wang, Suzhou City (CN); Yeye Guo, Suzhou City (CN); Lekai Chen, Suzhou City (CN); Dongli Zhang, Suzhou City (CN); Huaisheng Wang, Suzhou City (CN)

(73) Assignee: Soochow University, Suzhou City (CN)

( * ) Notice: Subject to any disclaimer, the term of this patent is extended or adjusted under 35 U.S.C. 154(b) by 361 days.

(21) Appl. No.: 18/684,734

(22) PCT Filed: Oct. 27, 2022

(86) PCT No.: PCT/CN2022/127850
§ 371 (c)(1),
(2) Date: Feb. 19, 2024

(87) PCT Pub. No.: WO2024/021338
PCT Pub. Date: Feb. 1, 2024

(65) Prior Publication Data
US 2024/0371937 A1     Nov. 7, 2024

(30) Foreign Application Priority Data
Jul. 26, 2022    (CN) ......................... 202210886067.4

(51) Int. Cl.
*H10D 62/13*     (2025.01)
*H10D 30/47*     (2025.01)
*H10D 30/63*     (2025.01)
*H10D 64/27*     (2025.01)
*H10D 64/64*     (2025.01)

(52) U.S. Cl.
CPC ........... *H10D 62/151* (2025.01); *H10D 30/47* (2025.01); *H10D 30/63* (2025.01); *H10D 64/516* (2025.01); *H10D 64/64* (2025.01)

(58) Field of Classification Search
None
See application file for complete search history.

(56) References Cited

U.S. PATENT DOCUMENTS 12,279,443 B2 *   4/2025   Wang ................... H10D 30/472
2026/0006822 A1 *   1/2026   Wang ................... H10D 30/475

* cited by examiner

*Primary Examiner* — Jack S Chen
(74) *Attorney, Agent, or Firm* — Wang Law Firm, Inc.

(57)         ABSTRACT

The present invention discloses an equivalent source and drain region optimized field-effect transistor device for solving the problem of short-channel effects of a field-effect transistor in the prior art. The field-effect transistor device includes an active layer, and the active layer includes a source region, a drain region and a channel region located between the source region and the drain region; when the device is on, an effective channel and an equivalent source region and an equivalent drain region away from the effective channel at least in the thickness direction of the channel region are formed in the channel region, and the field-effect transistor device communicates the source region and the drain region via the effective channel and the equivalent source region and the equivalent drain region to contribute a working current, wherein the length of the equivalent source region is greater than that of the equivalent drain region.

13 Claims, 18 Drawing Sheets

100F

100A

100B

FIELD-EFFECT TRANSISTOR DEVICE WITH EQUIVALENT SOURCE AND DRAIN REGION OPTIMIZATION

TECHNICAL FIELD

The present invention belongs to the technical field of semiconductor devices, and specifically relates to an equivalent source and drain region optimized field-effect transistor device.

BACKGROUND ART

With the development of integrated circuit technology, the gate length (corresponding to the channel length) of field-effect transistors is shrinking, and VLSI chips based on sub-micron or even less than 10 nm technology node devices have been mass-produced. For such small-size devices, how to cope with the short-channel effects is an important challenge in device technology. The threshold voltage and subthreshold characteristics of small-size devices are all degraded by short-channel effects, which shows that the threshold voltage of the device is no longer a constant, but decreases with the decrease of channel length and the increase of drain terminal voltage of the device. Subthreshold swing in device transfer characteristics also degrades simultaneously.

In order to improve short-channel effects of field-effect transistor devices, current architecutures mainly include fin field-effect transistor (FinFET), silicon-on insulator (SOI), lightly-doped drain (LDD) structure and a metal source/drain Schottky barrier transistor (SB MOSFET). The channel region of FinFET is a 3D fin-type slice, and the gate electrode is a three-sided surrounding gate structure. The two side gates enhance the control of the gate electrode on the channel potential and effectively suppress short-channel effects. The preparation process of the device in this scheme is much more complex than that of the planar device. At present, chips below the 22 nm technology node widely adopt FinFET scheme. The SOI technology introduces a buried oxide layer between the silicon channel layer and the bulk substrate, which may effectively suppress the leakage current between the source and drain under the condition that the channel layer is very thin and fully depleted. The difficulty of this scheme lies in the very high cost of SOI silicon wafers. At present, chips based on the 10-nm technology node of the SOI scheme have been mass-produced. The lightly-doped drain (LDD) is arranged near the drain channel while the source and drain regions far away from the channel are still heavily doped. The drain terminal PN junction formed by the lightly-doped region reduces the influence of the drain voltage on the channel, and is a mainstream technical solution of a sub-micron devices, in which the on-state current and field-effect mobility of the device are both reduced to a certain extent by the influence of the LDD. The on-state current of Schottky barrier transistor is mainly determined by the tunneling current through the Schottky barrier between metal source electrode and semiconductor channel, which is not sensitive to short-channel effects. The scheme is difficult to process, and the choice of barrier material is limited, and it is difficult to balance the suppression of the off-state current.

On the other hand, the kink effect on the output characteristic curve of the short-channel device has also received much attention. When the device works in the saturation regime, the higher drain voltage makes the drain of the device deplete and forms a high electric field region, where the carrier is prone to impact ionization effect, and couples with the parasitic bipolar transistor of MOS device to amplify, so that the drain current increases rapidly with the increase of drain voltage, forming the so-called kink current, the output characteristic curve of the device greatly warps, seriously affecting the normal output characteristics.

Common methods for improving the kink effect mainly include increasing the channel length and lightly-doped drain (LDD) structure of the device. Increasing the channel length may reduce the impact of carriers generated by impact ionization at the drain terminal, weaken the parasitic transistor effect and mitigate the kink effect. However, an increase in channel length will correspondingly decrease the output current of the device. The LDD structure may reduce the peak electric field intensity in the depletion region at the drain and weaken the carrier impact ionization effect, thus suppressing the kink effect. However, the LDD structure may introduce additional parasitic resistance and reduce the field-effect mobility and on-state current of the device.

The information disclosed in this background art is merely intended to enhance an understanding of the general background of the present invention and should not be taken as an acknowledgment or any form of suggestion that the information constitutes prior art that is known to one of ordinary skill in the art.

SUMMARY OF THE INVENTION

It is an object of the present invention to provide an equivalent source and drain region optimized field-effect transistor device for solving the problem of short-channel effects of a field-effect transistor in the prior art.

In order to achieve the above-mentioned object, the present invention provides an equivalent source and drain region optimized field-effect transistor device which includes an active layer. The active layer includes a source region, a drain region and a channel region located between the source region and the drain region. When the device is in an on-state, an effective channel and an equivalent source/drain region away from the effective channel at least in the thickness direction of the channel region are formed in the channel region. The source region and the drain region are connected via the effective channel and the equivalent source/drain region to contribute a working current. The length of the equivalent source region is greater than the length of the equivalent drain region.

In an embodiment, the equivalent source region is a first conductive region located in the channel region and in communication with the source region. The equivalent drain region is a second conductive region located in the channel region and in communication with the drain region, and the first conductive region and the second conductive region have a spacing therebetween.

In an embodiment, including a first gate electrode arranged on one side surface of the active layer, overlapping a vertical projection of the first conductive region and the second conductive region on the channel region; wherein the first gate electrode may control the channel region and form a channel therein, and a portion of the channel which does not overlap the vertical projection of the first conductive region and the second conductive region on the channel region constitutes the effective channel.

In one embodiment, when the device is on, a conductance of the first conductive region and the second conductive region is greater than a conductance of a rest portion of the channel except for the effective channel, so that the first conductive region may inject carriers into the effective channel and the effective channel may inject carriers into the second conductive region.

In one embodiment, the conductance of the first conductive region and the second conductive region is at least three times greater than the conductance of the rest portion of the channel except for the effective channel.

In one embodiment, when the device is at on-state, a conductance per unit length of an effective channel in the channel is less than a conductance per unit length of a rest portion of the channel except for the effective channel.

In one embodiment, when the field-effect transistor device is an N-type device, a work function of a portion of the first gate electrode corresponding to an effective channel is greater than a work function of a rest portion of the first gate electrode. When the field-effect transistor device is a P-type device, a work function of a portion of the first gate electrode corresponding to the effective channel is less than a work function of the rest portion of the first gate electrode.

In one embodiment, the field-effect transistor device includes a gate insulating layer arranged between the first gate electrode and a channel region. A thickness of a portion of the gate insulating layer corresponding to the effective channel is greater than a thickness of a rest portion of the gate insulating layer.

In one embodiment, the field-effect transistor device includes a gate insulating layer arranged between the first gate electrode and a channel region, wherein a dielectric constant of a portion of the gate insulating layer corresponding to the effective channel is greater than a dielectric constant of a rest portion of the gate insulating layer.

In one embodiment, when the field-effect transistor device is an N-type device, it satisfies:
$0.2V < V_{th\_L_{eff}} - V_{th\_L_{ed}} \leq 0.7V$, preferably $0.3V < V_{th\_L_{eff}} - V_{th\_L_{ed}} \leq 0.6V$, preferably $0.4V < V_{th\_L_{eff}} - V_{th\_L_{ed}} \leq 0.5V$;
When the field-effect transistor device is a P-type device, it satisfies:
$0.2V < V_{th\_L_{ed}} - V_{th\_L_{eff}} \leq 0.7V$, preferably $0.3V < V_{th\_L_{ed}} - V_{th\_L_{eff}} \leq 0.6V$, preferably $0.4V < V_{th\_L_{ed}} - V_{th\_L_{eff}} \leq 0.5V$;
wherein, $V_{th\_L_{eff}}$ is a threshold voltage of a portion of the first gate electrode corresponding to the effective channel, and $V_{th\_L_{ed}}$ is a threshold voltage of a portion of the first gate electrode corresponding to the equivalent drain region.

In one embodiment, the field-effect transistor device further includes a second gate electrode arranged on one side surface of the active layer adjacent to the first conductive region and the second conductive region. The second gate electrode may control the formation of the first conductive region and the second conductive region in the channel region.

In one embodiment, the first conductive region and second conductive region are formed by carriers introduced by surface doping on one side surface of the channel region away from the effective channel.

In one embodiment, the field-effect transistor device further includes an insulating layer arranged on one side surface of the active layer away from the effective channel. The first conductive region and the second conductive region are composed of carriers generated by injecting charges in the insulating layer at a location adjacent to the insulating layer in the channel region through electrostatic induction.

In one embodiment, the field-effect transistor device further includes a semiconductor material layer arranged on one side surface of the active layer away from the effective channel. The active layer and the semiconductor material layer form a heterostructure. The first conductive region and the second conductive region are composed of a two-dimensional electron gas channel or a two-dimensional hole gas channel distributed in the heterostructure.

In one embodiment, the first conductive region and the second conductive region are composed of a two-dimensional electron gas channel or a two-dimensional hole gas channel and formed by surface treatment on one side surface of the channel region away from the effective channel.

In one embodiment, a length ratio of the equivalent source region to the equivalent drain region ranges from 1.1:1 to 2.5:1; preferably from 1.2:1 to 2.3:1; preferably from 1.1:1 to 2.2:1; preferably from 1.4:1 to 2.2:1; preferably from 1.8:1 to 2.2:1.

In one embodiment, the sum of the lengths of the equivalent source region and the equivalent drain region is no greater than three times that of the effective channel length.

In one embodiment, the source region and the drain region are a doped semiconductor or a Schottky metal source/drain.

In one embodiment, a gate electrode of the field-effect transistor device is a metal-insulating layer-semiconductor MOS structure gate electrode or a Schottky junction gate electrode.

In one embodiment, the active layer includes at least two semiconductor materials varying along a thickness direction or a planar extension direction thereof.

In one embodiment, the field-effect transistor device is a planar structure device or a vertical structure device.

Compared with the prior art, in the embodiments of the present invention, when the device is on, an effective channel and an equivalent source region and an equivalent drain region away from the effective channel in the thickness direction of the channel region are formed in the channel region, so that the source region and the drain region are connected to contribute a working current; in this way, the equivalent drain region (source region) in communication with the drain (source) region is structurally away from the effective channel, so that the influence of the drain voltage on the effective channel may be reduced; furthermore, the peak electric field in the depletion region of the drain is reduced when the device works in the saturation regime, thus the short-channel effects of the device is suppressed and the output characteristics of the device are improved. Meanwhile, by arranging the length of the equivalent source region to be greater than that of the equivalent drain region, it is possible to significantly improve the output characteristics of the device without a significant loss in the ability to suppress short-channel effects.

On the other hand, according to different types of devices, by arranging the work function of the portion of the first gate electrode corresponding to the equivalent source region and the equivalent drain region of the device to be different from the work function of the portion corresponding to the effective channel, it may not only ensure a good suppression ability for short-channel effects, but also enable the device to have a relatively small saturated voltage $V_{dsat}$, and a relatively large saturated current Idsat, kink voltage and output impedance Ro.

DETAILED DESCRIPTION OF THE INVENTION

The present invention will now be described in detail with reference to the embodiments illustrated in the accompanying drawings. However, these embodiments do not limit the present invention, and a person of ordinary skill in the art would have been able to make structural, method, or functional changes according to these embodiments, which are all included in the scope of protection of the present invention.

Figure 1:
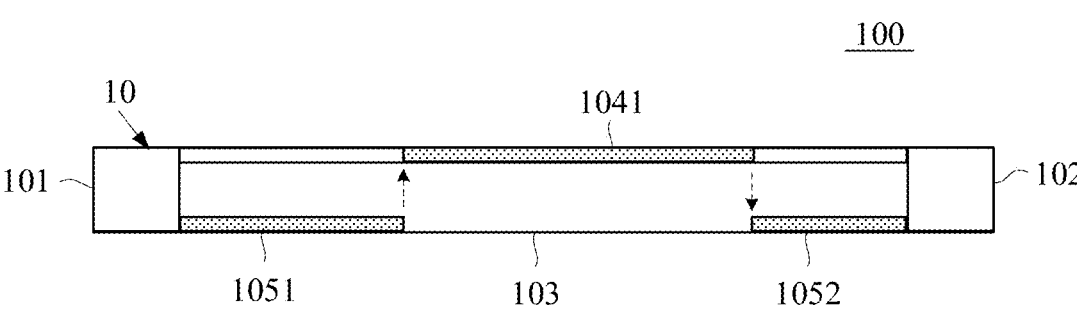
FIG. 1 is a schematic state diagram of an equivalent source region, an equivalent drain region and an effective channel are formed when an equivalent source and drain region optimized field-effect transistor device is in an on-state of an embodiment of the present invention.

Referring to FIG. 1, a specific embodiment of an equivalent source and drain region optimized field-effect transistor device of the present invention is introduced. In this embodiment, the field-effect transistor device 100 includes an active layer 10, and the active layer 10 includes a source region 101, a drain region 102, and a channel region 103.

A source region 101 and a drain region 102 are respectively located on two sides of the active layer 10, and a channel region 103 is located between the source region 101 and the drain region 102. In conjunction with the schematic view shown in FIG. 1, when the device is at on-state, an effective channel 1041, an equivalent source region 1051 and an equivalent drain region 1052 away from the effective channel 1041 in the thickness direction of the channel region 103 are now formed in the channel region 103 of the field-effect transistor, and the field-effect transistor device 100 communicates the source region 101 and the drain region 102 via the effective channel 1041, the equivalent source region 1051 and the equivalent drain region 1052, so as to contribute a working current.

In some embodiments of the present invention, the equivalent source region 1051 and equivalent drain region 1052 can also be away from the effective channel 1041 in the length direction of the channel region, in addition to the thickness direction of the channel region. In these embodiments, the "being away from" in either the thickness or length direction of the channel region is defined as long as the effective channel 1041, the equivalent source region 1051, and the equivalent drain region 1052 can normally communicate the source region 101 and the drain region 102 when the device is on.

In a typical field-effect transistor device 100, the source region 101 in the active layer 10 is used to provide carriers when the device is at on-state, and the drain region 102 is used to collect carriers provided by the source region 101. Correspondingly, in this invention, the equivalent source region 1051 refers to a structure in which a portion of carriers provided by the source region 101 are directly injected into the effective channel 1041, and the equivalent drain region 1052 refers to a structure in which a portion of carriers are directly received from the effective channel 1041 and injected into the drain region 102.

Figure 2:
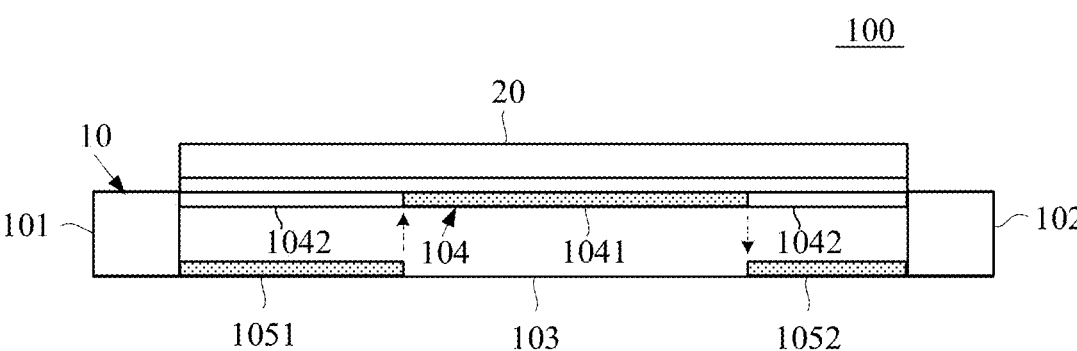
FIG. 2 is a schematic structural view of an equivalent source and drain region optimized field-effect transistor device, which is in the on-state of an embodiment of the present invention.

In conjunction with referring to FIG. 2, the term "effective channel 1041" as mentioned in this invention refers to the portion of the channel through which the carriers serving as the working current will pass when the device is on. Taking this embodiment as an example, one side surface of the active layer 10 may be arranged with the first gate electrode 20, and there is no spacing between the vertical projection of the first gate electrode 20 on the active layer 10 and the source region 101 and the drain region 102. Thus, when a gate voltage is applied to the first gate electrode 20 to turn the device on, a channel 104 may be controllably formed beneath the first gate electrode 20 and structurally connected to the source region 101 and the drain region 102 correspondingly. From a functional point of view, however, only the portion of the channel that does not overlap the vertical projection of the equivalent source region 1051 and the equivalent drain region 1052 on the channel region 103 is used to transfer the full working current, and therefore only this portion of the channel will be referred to herein as the "effective channel 1041".

In this embodiment, when the device is on, the carrier path includes two main portions: one portion enters the equivalent source region 1051, the effective channel 1041, the equivalent drain region 1052 and the drain region 102 in sequence from the source region 101, and the other portion enters the drain region 102 directly through the channel 104 from the source region 101. The remaining portion of the channel 104 except for the effective channel 1041 is used to transfer only a portion of the working current as viewed from the carrier path.

It may be seen that the effective channel 1041 in this invention does not limit itself to having a different device structure or parameter setting than the rest portion of the channel 104. Indeed, in some embodiments, the channel 104 described above may be integrally formed in the channel region, and only by the arrangement of the equivalent source region 1051 and the equivalent drain region 1052, the carriers provided by the source region 101 are not injected directly into the drain region 102 all through the channel 104 when the device is on. However, the regulation of the channel, such as changing the work function of the first gate electrode corresponding to the effective channel, the thickness of the gate insulating layer, etc. which may be shown in some embodiments below, should not be considered as necessary preconditions for forming the effective channel.

The arrangement of the equivalent source region 1051 and the equivalent drain region 1052 is equivalent to shortening the length of the portion of the channel 104 which may fully conduct the working current, namely, creating a spacing between the effective channel 1041 and the source region 101 and the drain region 102. In addition, the equivalent drain region 1052 in communication with the drain region 102 is structurally away from the effective channel 1041, reducing the influence of the drain potential on the effective channel 1041; while the equivalent source region 1051 in communication with the source region 101 is structurally away from the effective channel 1041, the potential of the equivalent source region 1051 remains the same as that of the source region (usually a zero potential), also reduces the influence of the drain potential on the effective channel 1041, so as to improve the short-channel effects of the device.

In this embodiment, the length of equivalent source region 1051 is greater than the length of equivalent drain region 1052. Furthermore, in one embodiment, the length ratio of the equivalent source region to the equivalent drain region ranges from 1.1:1 to 2.5:1; preferably from 1.2:1 to 2.3:1; preferably from 1.1:1 to 2.2:1; preferably from 1.4:1 to 2.2:1; preferably from 1.8:1 to 2.2:1. Furthermore, the sum of the lengths of the equivalent source region and equivalent drain region may be no greater than three times the effective channel length.

Within the length ratio range of the equivalent source region and the equivalent drain region shown above, the kink voltage and the output impedance of the device may be improved on the basis of almost not losing the saturated drain voltage and the saturated drain current; that is, the output characteristics of the device may be improved without much influence on suppression of short-channel effects.

Figure 3:
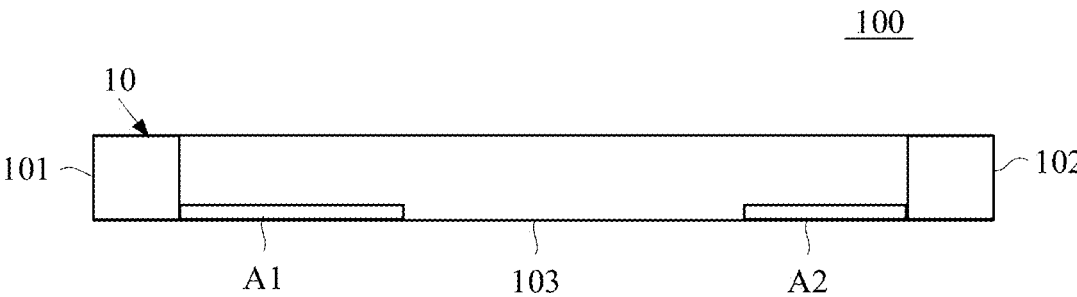
FIG. 3 is a schematic state view of a conductive region formed in an equivalent source and drain region optimized field-effect transistor device of an embodiment of the present invention.

In conjunction with referring to FIG. 3, in the specific preparation of the equivalent source region 1051 and the equivalent drain region 1052, a first conductive region A1 in communication with the source region 101 may be formed in the channel region 103, and a second conductive region A2 in communication with the drain region 102 may be formed in the channel region 103, with a spacing between the first conductive region A1 and the second conductive region A2.

When the device is on, the conductance of the first conductive region A1 and the second conductive region A2 is arranged to be greater than the conductance of the rest portion 1042 of the channel 104 except for the effective channel 1041 so that the first conductive region A1 may inject carriers into the effective channel 1041 and the effective channel 1041 may inject carriers into the second conductive region A2. In particular, the carriers in the source region 101 would be attracted by the equivalent source region 1051 with a greater conductance, and would not be directly injected into the rest portion 1042 of the channel 104 which is directly connected to the source region 101; similarly, the carriers transferring in the effective channel 1041 will also be attracted by the equivalent drain region 1052, rather than transferring entirely through the rest portion 1042 of the channel 104.

To achieve the carrier injection arrangement herein between the equivalent source region 1051, the equivalent drain region 1052, and the effective channel 1041, the conductance of the first conductive region A1 and the second conductive region A2 may be arranged to be at least three times greater than the conductance of the rest portion 1042 of the channel 104 except for the effective channel 1041. Furthermore, since the carriers flow in the thickness direction of the channel region 103 during the above-mentioned "injection" process, the spacing of the first conductive region A1 and the second conductive region A2 and the effective channel 1041 in the thickness direction of the channel region 103 in the present embodiment may be arranged to 5 nm to 10 μm, or more preferably 10 nm to 1 μm, or more preferably 10 nm to 100 nm depending on the specific design of different devices, to ensure the normal injection of the carriers and the performance of the devices.

It should be noted that the "carrier" mentioned in the present invention refers to a charge particle capable of freely moving in the channel/conductive region with corresponding polarities. Generally, the electron in the N-type channel or the hole in the P-type channel is referred to as the "carrier" herein, and correspondingly, the hole in the N-type channel or the electron in the P-type channel is not referred to as the "carrier" herein. Therefore, in the present invention, the polarities of the effective channel 1041, the first conductive region A1 and the second conductive region A2 are arranged to be the same, so that the carrier interaction of the effective channel with the first conductive region A1 and the second conductive region A2 can ultimately substantially contribute to the working current of the device.

Figure 4:
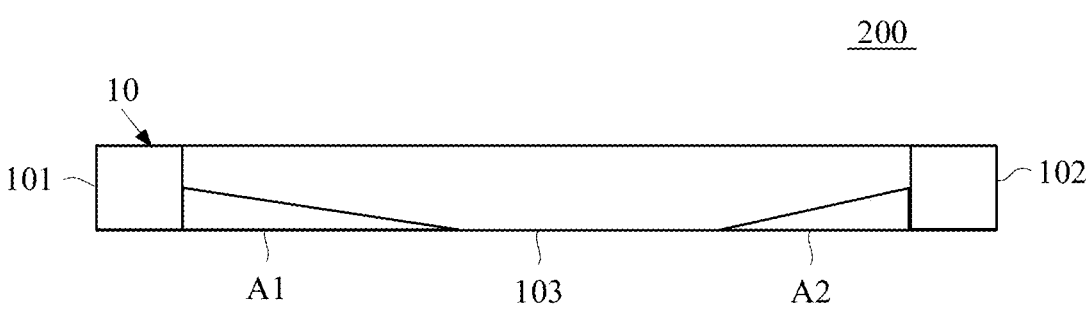
FIGS. 4 to 7 are schematic structural views of an equivalent source and drain region optimized field-effect transistor device of various embodiments of the present invention.
Figure 5:
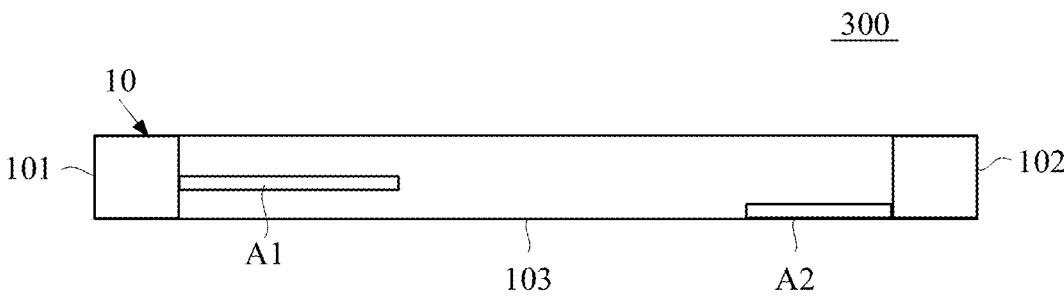

The form and location of the first conductive region A1 and the second conductive region A2 may be arranged according to the invention requirements of the device and is not limited to the form shown in FIG. 3. For example, the first conductive region A1 and the second conductive region A2 in the field-effect transistor device 200 shown in FIG. 4 may have a greater overall thickness and irregular region shape relative to FIG. 3. For another example, in the field-effect transistor device 300 shown in FIG. 5, the first conductive region A1 and the second conductive region A2 are not located at the same height in the thickness direction of the channel region.

In the above-described embodiment, a structure in which a portion of a channel controllably formed by gate electrode constitutes an effective channel has been shown. In such a structure, to further improve the ability of the device to suppress short-channel effects, a conductance per unit length of an effective channel in the channel is less than a conductance per unit length of a rest portion of the channel except for the effective channel. Some corresponding embodiments are described below.

Figure 6:
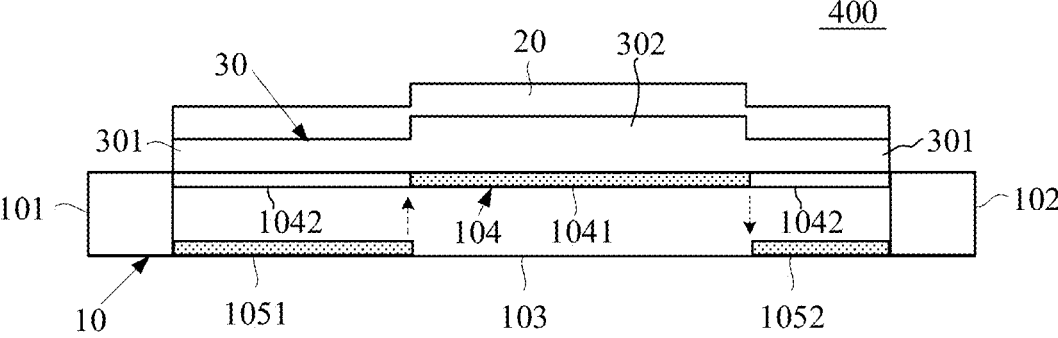

Referring to FIG. 6, yet another embodiment of a field-effect transistor device 400 of the present invention is described.

The field-effect transistor device 400 includes an active layer 10, and the active layer 10 includes a source region 101, a drain region 102, and a channel region 103. A source region 101 and a drain region 102 are respectively located on two sides of the active layer 10, and a channel region 103 is located between the source region 101 and the drain region 102.

The insulating layer 30 and the first gate electrode 20 are successively arranged above the channel region, and the thickness of the gate insulating layer 302 corresponding to the effective channel 1041 is greater than the thickness of the gate insulating layer 301 of the rest portion. That is to say, the gate insulating layer 301 of the corresponding portion of the equivalent source region 1051 and the equivalent drain region 1052 is relatively thinner so that the modulation ability of the corresponding gate electrode of the rest portion of the channel 1042 except for the effective channel 1041 to the corresponding portion of the channel 1042 may be enhanced, thereby increasing the conductance of the corresponding portion of the channel 1042.

Cooperatively, in this embodiment, the dielectric constant of the gate insulating layer 302 corresponding to the effective channel 1041 may also be arranged greater than that of the rest portion of the gate insulating layer 301 to further increase the conductance of the rest portion of the channel 1042 except for the effective channel 1041.

Figure 7:
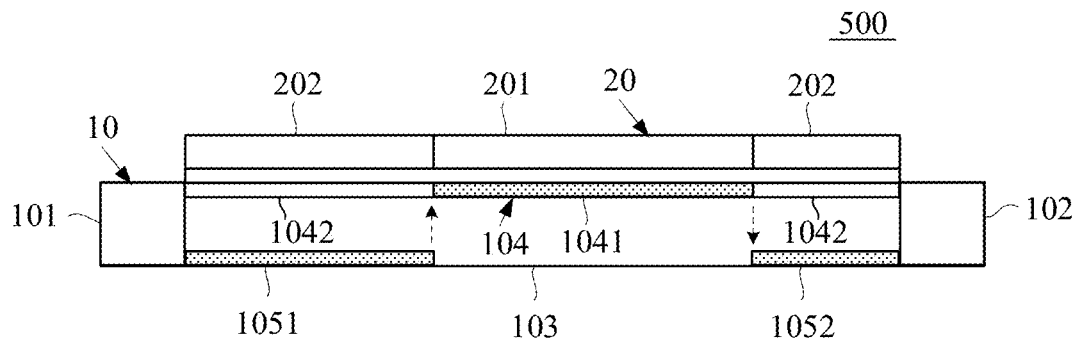

Referring to FIG. 7, yet another embodiment of a field-effect transistor device 500 of the present invention is described.

The field-effect transistor device 500 includes an active layer 10, and the active layer 10 includes a source region 101, a drain region 102, and a channel region 103. A source region 101 and a drain region 102 are respectively located on two sides of the active layer 10, and a channel region 103 is located between the source region 101 and the drain region 102.

A first gate electrode 20 is arranged above the channel region 103, and a portion 201 corresponding to the effective channel 1041 and a rest portion 202 of the first gate electrode 20 are made of different materials, so that the portion 201 of the first gate electrode 20 corresponding to the effective channel 201 and the remaining portion 202 have different modulation abilities for the channel formed correspondingly, and the conductance of the effective channel 1041 is realized to be greater than the conductance of the rest portion 1042 of the channel 104 except for the effective channel 1041.

In the present embodiment, if the field-effect transistor device 500 is an N-type device, the work function of the portion 201 of the first gate electrode 20 corresponding to the effective channel 1041 is arranged to be greater than the work function of the rest portion 202 of the first gate electrode 20; correspondingly, if the field-effect transistor device 500 is a P-type device, the work function of the portion 201 of the first gate electrode 20 corresponding to the effective channel 1041 is arranged to be less than the work function of the rest portion 202 of the first gate electrode 20.

In particular, in the case of an N-type device, a metal with a greater work function, such as gold, platinum, or P-type doped (P+) polysilicon, or ITO, RuO2, WN, MoN, etc. with a greater work function obtained by adjusting the composition of the compound, may be used as a gate electrode material in the portion 201 of the first gate electrode 20 corresponding to the effective channel 1041; a metal with a less work function, such as aluminum, hafnium, titanium, or N-type doped (n+) polysilicon, or Ru—Hf, WN, HfN, TiN, TaN, TaSiN, etc. with a less work function obtained by adjusting the composition of the compound, may be used as a gate electrode material in the rest portion 202. In the case of a P-type device, a metal with a less work function, such as aluminium, hafnium, titanium, or N-type doped (n+) polysilicon, or Ru—Hf, WN, HfN, TiN, TaN and TaSiN, etc. with a less work function obtained by adjusting the composition of the compound, may be used as a gate electrode material in the portion 201 of the first gate electrode 20 corresponding to the effective channel 1041; a metal with a greater work function, such as gold, platinum, or P-type doped (P+) polysilicon, or ITO, RuO2, WN, MoN, etc. with a greater work function obtained by adjusting the composition of the compound, may be used as a gate electrode material in the rest portion 202.

Illustratively, in the above embodiment, by adjusting the work function, the thickness of the first gate electrode, and the dielectric constant of the gate insulating layer, it is possible to make the field-effect transistor device be an N-type device that satisfies:

$0.2V<V_{th\_L_{eff}}-V_{th\_L_{ed}}\leq0.7V$, preferably $0.3V<V_{th\_L_{eff}}-V_{th\_L_{ed}}\leq0.6V$, preferably $0.4V<V_{th\_L_{eff}}-V_{th\_L_{ed}}\leq0.5V$;

and make the field-effect transistor device be a P-type device that satisfies:

$0.2V<V_{th\_L_{ed}}-V_{th\_L_{eff}}\leq0.7V$, preferably $0.3V<V_{th\_L_{ed}}-V_{th\_L_{eff}}\leq0.6V$, preferably $0.4V<V_{th\_L_{ed}}-V_{th\_L_{eff}}\leq0.5V$;

Wherein, $V_{th\_L_{eff}}$ is a threshold voltage of a portion of the first gate electrode corresponding to the effective channel, and $V_{th\_L_{ed}}$ is a threshold voltage of a portion of the first gate electrode corresponding to the equivalent drain region.

The manner in which the first conductive region and the second conductive region are formed in the present invention is described below in some specific embodiments:

Embodiment 1

The first conductive region A1 and the second conductive region A2 are formed by doping the introduced carriers on one side surface of the channel region 103A away from the effective channel 1041A.

Figure 8:
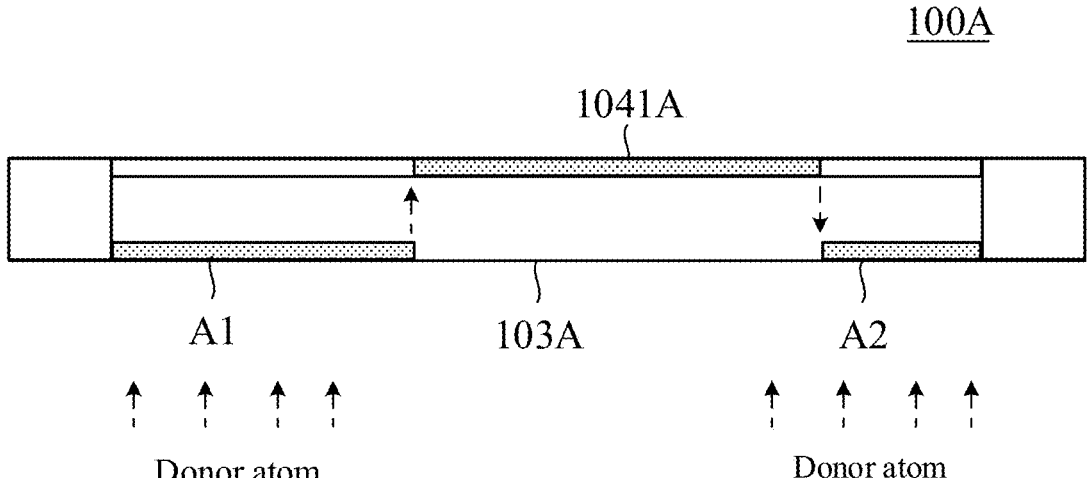
FIGS. 8 to 15 are schematic views of the fabrication of conductive regions of various embodiments of the present invention.
Figure 9:
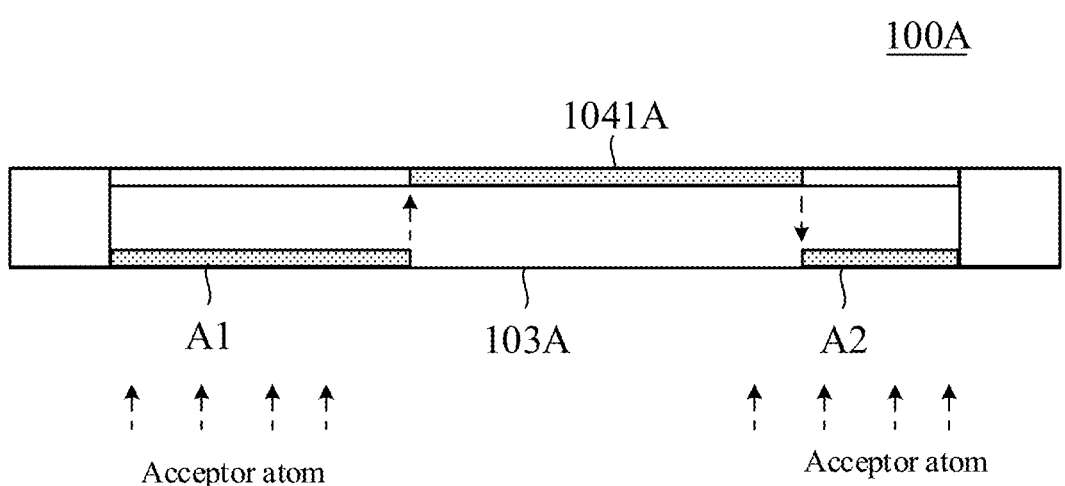

Correspondingly, referring to FIG. 8, in the case of an N-type silicon-based device 100A, the doping concentration at the interface may be varied by doping donor atoms, such as phosphorus, arsenic, etc. at the surface of the channel region 103A away from the effective channel 1041A. Referring to FIG. 9, in the case of a P-type silicon-based device 100A, the doping concentration at the interface may be varied by doping acceptor atoms, such as boron, at the surface of the channel region 103A away from the effective channel 1041A.

Embodiment 2

Figure 10:
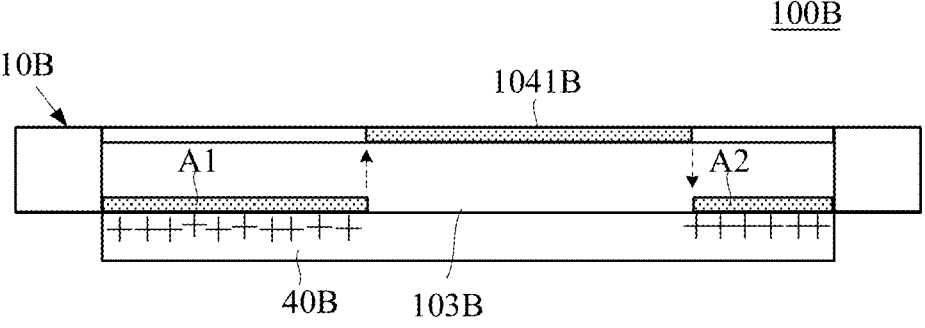
Figure 11:
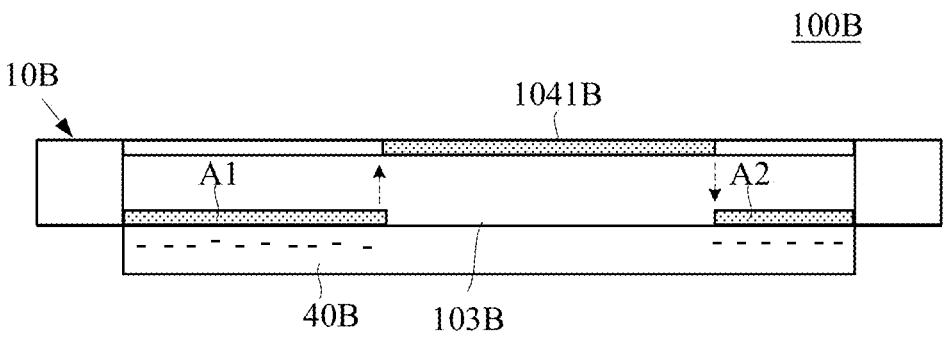

In conjunction with FIGS. 10 and 11, the field-effect transistor device 100B further includes an insulating layer 40B arranged on one side surface of the active layer 10B away from the effective channel 1041B. The first conductive region A1 and the second conductive region A2 are formed on one side surface of the channel region by electrostatic induction from injecting charges in the insulating layer 40B.

Referring to FIG. 10, in the case of an N-type device, this may be achieved by local injection of positive charges, such as H+, holes, in the insulating layer 40B. Referring to FIG. 11, in the case of a P-type device, this may be achieved by local injection of negative charges, such as F−, Cl−, electrons, etc. in the insulating layer 40B. In this manner, a high density of fixed charges is formed in the insulating layer 40B, and the carriers of the first conductive region A1 and the second conductive region A2 are generated adjacent to the insulating layer 40B in the channel region 103B by electrostatic induction. It should be noted that "local" herein refers to a portion of the insulating layer 40B corresponding to the channel region where the first conductive region A1 and the second conductive region A2 are desired to be formed.

In a particular charge injection process, charge may be injected into the insulating layer 40B at a location adjacent to the channel region 103B to enable the first conductive region A1 and the second conductive region A2 formed in the channel region 103B to store more carriers. Of course, in some other alternative embodiments, a "double insulating layer" structure may also be used, specifically including a charge trapping layer arranged on the surface of the channel region 103B, and a conventional insulating layer overlying the charge trapping layer. The charge trapping layer may be made of a material that is more likely to store charge, or nanoparticles of metal or semiconductor may be introduced therein to more stably store charge, thereby ensuring stable and controllable carriers in the conductive region.

Embodiment 3

Figure 12:
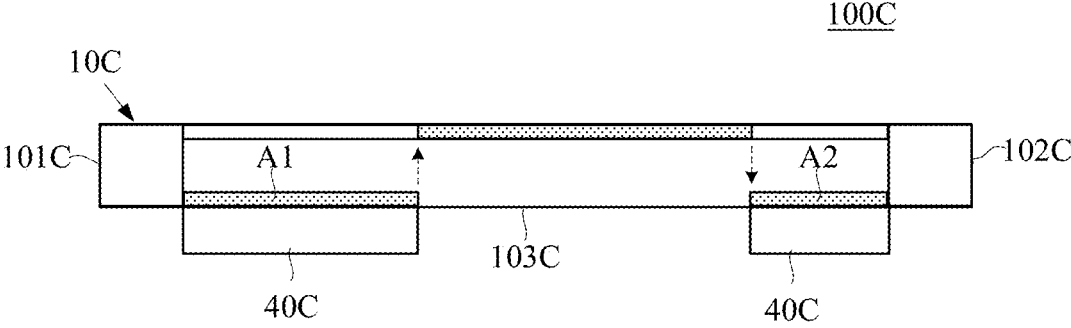

Referring to FIG. 12, the field-effect transistor device 100C includes a semiconductor material layer 40C arranged on the active layer 10C, the semiconductor material layer 40C and the active layer 10C constitute a heterostructure, and the first conductive region A1 and the second conductive region A2 are formed of a two-dimensional electron gas channel or a two-dimensional hole gas channel distributed in the heterostructure.

In particular, the semiconductor material layer 40C and the active layer 10C have different band gap widths, and the semiconductor material layer 40C may be divided into two portions respectively connected to the source region 101C and the drain region 102C, so that the formed two-dimensional electron gas channel does not conduct the source and drain regions.

Of course, in some alternative embodiments, a two-dimensional electron gas channel or a two-dimensional hole gas channel may also be formed, such as by surface treatment of the channel region 103C, and such alternative embodiments known to those skilled in the art to form a two-dimensional electron gas channel or a two-dimensional hole gas channel are intended to be within the scope of the present invention. Furthermore, the semiconductor material layer 40C described herein may be a barrier layer, which may be doped or intrinsic.

Embodiment 4

Figure 13:
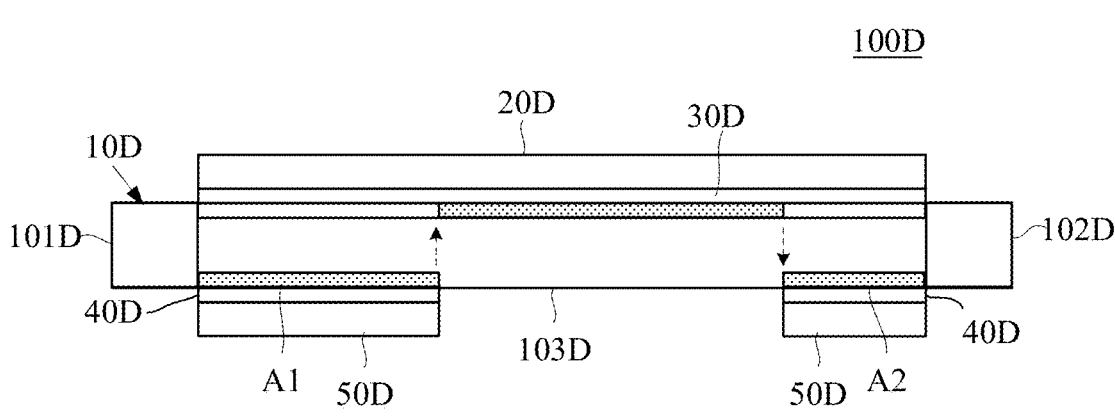

Referring to FIG. 13, the field-effect transistor device 100D is fabricated as a device including at least two gate electrodes. In particular, the field-effect transistor device 100D includes a first gate insulating layer 30D and a first gate electrode 20D sequentially arranged on one side surface of the active layer 10D, and a second gate insulating layer 40D and a second gate electrode 50D sequentially arranged on one side surface of the active layer 10D adjacent to the first conductive region A1 and the second conductive region A2.

The second gate electrode 50D is correspondingly divided into two portions, one connected to the source region 101D in a vertical projection on the active layer 10D and the other connected to the drain region 102D in a vertical projection on the active layer 10D. In this way, when an appropriate bias voltage is applied to the second gate electrode 50D of the two portions, the first conductive region A1 communicating the source region 101D and the second conductive region A2 communicating the drain region 102D may be formed at corresponding locations in the channel region 103D, respectively.

In this embodiment, the absolute value of the bias voltage applied to the second gate electrode 50D should be greater than the absolute value of the turn-on voltage applied to the device. Correspondingly, in the case of an N-type device, a positive bias voltage greater than that of the first gate electrode 20D is applied to the second gate electrode 50D; in the case of a P-type device, a negative bias voltage having an absolute value greater than that of the first gate electrode 20D is applied to the second gate electrode 50D.

Embodiment 5

Figure 14:
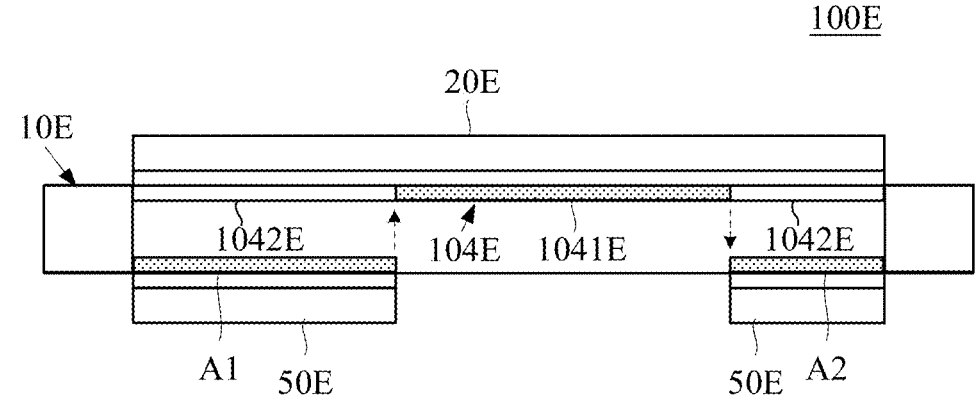

Referring to FIG. 14, the field-effect transistor device 100E is fabricated to include at least two gate electrodes similar to that of Embodiment 4. However, differently, in this embodiment, in order to enable the conductance of the first conductive region A1 and the second conductive region A2 to be greater than the conductance of the portion 1042E of the channel 104E except for the effective channel 1041E, it is possible to use the first gate electrode 20E and the second gate electrode 50E of gate electrode materials with different work functions. That is to say: it may be achieved by a work function difference between the first gate electrode 20E and the active layer 10E that is not equal to the work function difference between the second gate electrode 50E and the active layer 10E.

Correspondingly, in the case of an N-type device, a metal with a greater work function, such as gold, platinum, or P-type doped (P+) polysilicon, or ITO, RuO2, WN, MoN, etc. with a greater work function obtained by adjusting the composition of the compound, may be used as a gate electrode material by the first gate electrode 20E; a metal with a less work function, such as aluminum, hafnium, titanium, or N-type doped (n+) polysilicon, or Ru—Hf, WN, HfN, TiN, TaN, TaSiN, etc. with a less work function obtained by adjusting the composition of the compound, may be used as a gate electrode material by the second gate electrode 50E. In the case of a P-type device, a metal with a less work function, such as aluminium, hafnium, titanium, or N-type doped (n+) polysilicon, or Ru—Hf, WN, HfN, TiN, TaN and TaSiN, etc. with a less work function obtained by adjusting the composition of the compound, may be used as a gate electrode material by the first gate electrode 20E; a metal with a greater work function, such as gold, platinum, or P-type doped (P+) polysilicon, or ITO, RuO2, WN, MON, etc. with a greater work function obtained by adjusting the composition of the compound, may be used as a gate electrode material by the second gate electrode 50E.

In an N-type device, the work function difference between the first gate electrode 20E and the active layer 10E may also be arranged to be greater than zero ($\Phi ms>0$ V), so that the channel 104E is an enhanced channel; at the same time, the work function difference between the second gate electrode 50E and the active layer 10E is arranged to be less than zero ($\Phi ms<0$ V), so that the first conductive region A1 and the second conductive region A2 may also form a certain number of carriers under the bias voltage applied thereon when the device is in an off-state. In a P-type device, the work function difference between the first gate electrode 20E and the active layer may be arranged to be less than zero ($\Phi ms<0$ V), so that the channel 104E is an enhanced channel; at the same time, the work function difference between the second gate electrode 50E and the active layer 10E is arranged to be greater than zero ($\Phi ms>0$ V), so that the first conductive region A1 and the second conductive region A2 may also form a certain number of carriers under the bias voltage applied thereon when the device is in an off-state.

Embodiment 6

Figure 15:
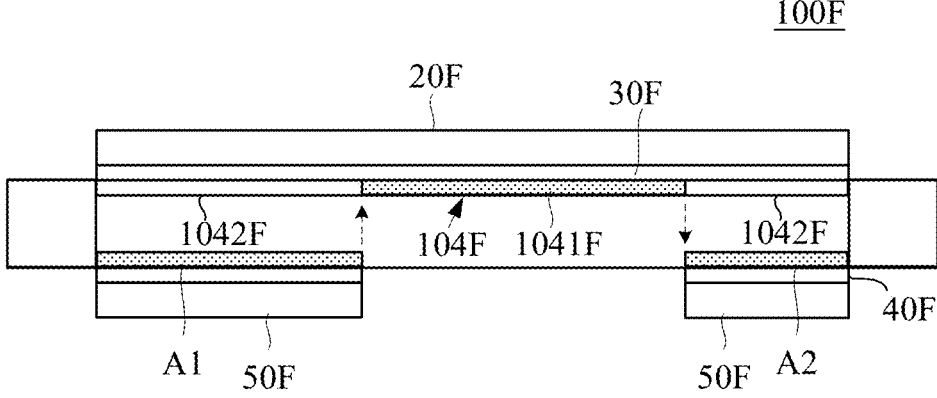

Referring to FIG. 15, the field-effect transistor device 100F is fabricated to include at least two gate electrodes 20F, 50F similar to that of Embodiment 4. However, differently, in this embodiment, in order to enable the conductance of the first conductive region A1 and the second conductive region A2 to be greater than the conductance of the portion 1042F of the channel 104F except for the effective channel 1041F, the capacitance per unit area of the second gate insulating layer 40F may be arranged to be greater than the capacitance per unit area of the first gate insulating layer 30F.

In particular, this may be achieved by adjusting the dielectric constants of the first gate insulating layer 30F and the second gate insulating layer 40F, or the thicknesses of the first gate insulating layer 30F and the second gate insulating layer 40F.

For example, when the thicknesses of the first gate insulating layer 30F and the second gate insulating layer 40F are equal, the dielectric constant of the second gate insulating layer 40F may be arranged to be higher than the dielectric constant of the first gate insulating layer 30F only considering the dielectric constant of the gate insulating layer. Illustratively, the first gate insulating layer 30F may use silicon dioxide and the second gate insulating layer 40F may use dielectric with a high dielectric constant, such as hafnium dioxide, aluminum oxide, etc.

For another example, when the materials of the first gate insulating layer 30F and the second gate insulating layer 40F are the same, the thickness of the second gate insulating layer 40F may be arranged to be less than the thickness of the first gate insulating layer 30F only considering the thickness of the gate insulating layer.

In particular device applications, the second gate electrode in embodiments 4-6 described above may also be directly floating or grounded, to avoid increasing the complexity of the device invention with excessive device connections.

Furthermore, the manner in which the conductive regions are formed in each of the above embodiments may be applied in combination with each other to achieve a better implementation effect.

The field-effect transistor device described in each of the above embodiments/embodiments may be a planar structure device or a vertical structure device. In the following, a SOI device (TFT device) will be taken as an example to illustrate the specific arrangement of the solution of the present invention when applied to a SOI device.

Embodiment 7

Figure 16:
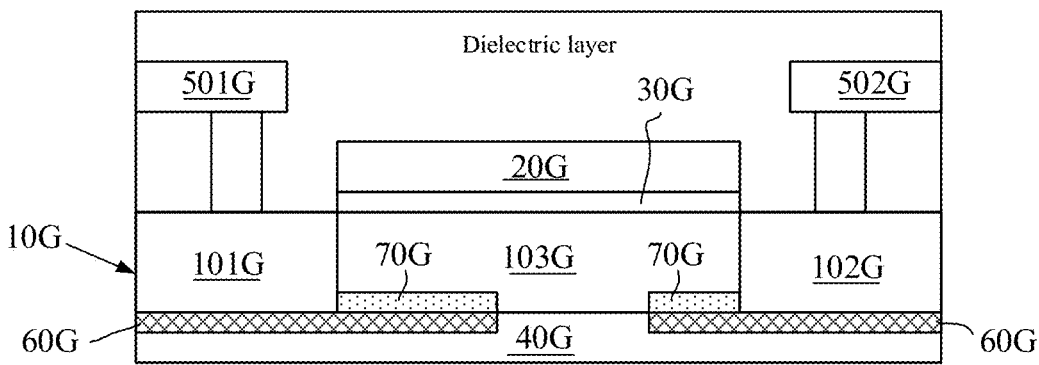
FIGS. 16 to 18 are schematic structural views of a SOI device applying an embodiment of the present invention.

Referring to FIG. 16, it is a TFT device 100G with a planar top gate structure, and includes a light-transmitting insulating substrate 40G, and an active layer 10G, a gate dielectric layer 30G and a gate electrode 20G which are successively arranged on the substrate 40G. Two sides of the active layer 10G are respectively doped to form a source region 101G and a drain region 102G, and are respectively externally connected to a source electrode and a drain electrode; the channel region 103G is located between the source region 101G and the drain region 102G.

A positive charge region 60G is formed on both sides of the source region 101G and the drain region 102G by ion implantation or the like on the substrate 40G. The positive charge region 60G and the gate electrode 20G have an overlapping portion between the vertical projections of the channel region 103G, and correspondingly, the positive charge region of the overlapping portion may form a two-dimensional electron gas 70G in the channel region 103G which is respectively connected to the source region 101G and the drain region 102G, wherein the two-dimensional electron gas 70G also constitutes a first conductive region and a second conductive region.

When the device is on, a channel is formed below the gate electrode 20G, and the portion of the channel with a vertical projection located between the first conductive region and the second conductive region constitutes the actual effective channel.

Embodiment 8

Figure 17:
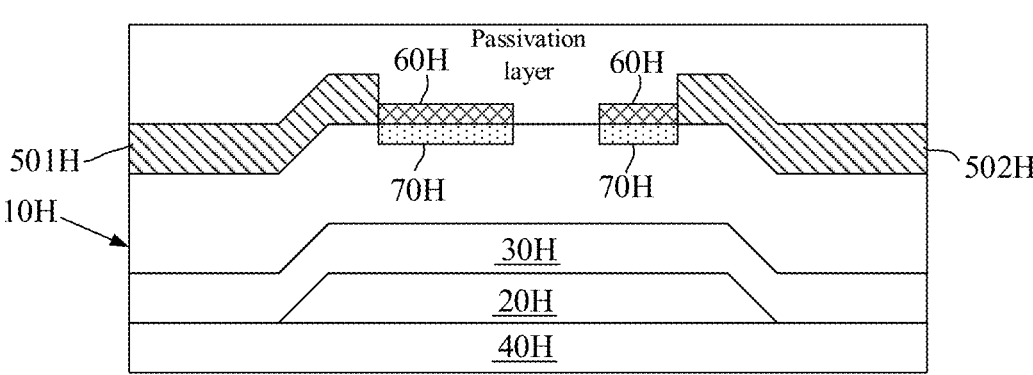

Referring to FIG. 17, it is a TFT device 100H with a planar bottom gate structure, and includes a light-transmitting insulating substrate 40H, and a gate electrode 20H, a gate dielectric layer 30H and an active layer 10H which are successively arranged on the substrate 40H. In the present embodiment, an upper metal source electrode 501H and a metal drain electrode 502H are respectively arranged on two sides of an active layer 10H, the active layer 10H may use an amorphous IGZO metal oxide semiconductor layer, and an ohmic contact is formed between the source electrode 501H and the drain electrode 502H and the active layer 10H. A portion of the active layer below the source electrode 501H and the drain electrode 502H constitutes a source region, a drain region respectively, and a channel region is thus located between the source region and the drain region.

The positive charge region 60H is formed by ion implantation in the passivation layer covered by the upper layer of the device, which is connected to the source electrode 501H and the drain electrode 502H. The positive charge region 60H and the gate electrode 20H have an overlapping portion between the vertical projections of the channel region, and correspondingly, the positive charge region of the overlapping portion may form a two-dimensional electron gas 70H in the channel region which is respectively connected to the source region and the drain region, and the two-dimensional electron gas 70H herein also constitutes a first conductive region and a second conductive region.

When the device is on, a channel is formed above the gate electrode 20H, and the portion of the channel with a vertical projection located between the first conductive region and the second conductive region constitutes the actual effective channel.

Embodiment 9

Figure 18:
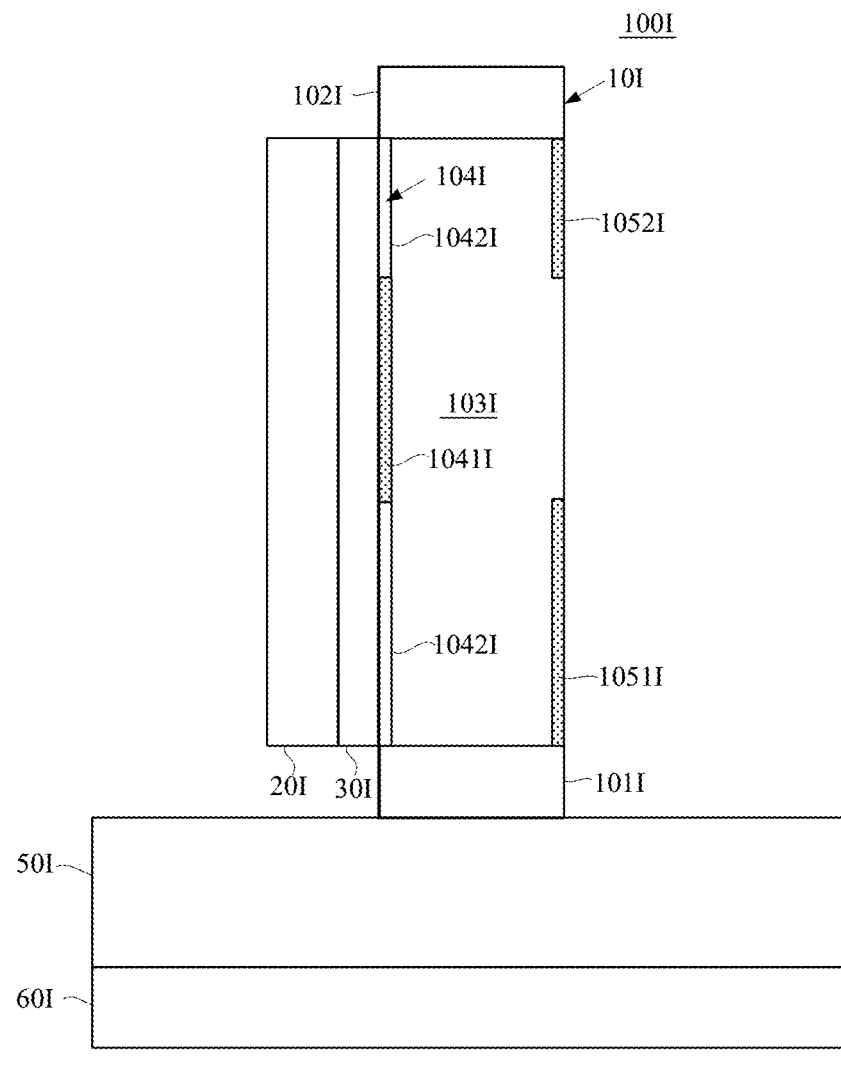

Referring to FIG. 18, it is a SOI device 100I with a vertical structure, and includes a substrate 60I, a buried insulating layer 50I and an active layer 10I successively arranged on the substrate 60I, a gate insulating layer 30I and a gate electrode 20I arranged on one side of the active layer 10I. The source region 101I and the drain region 102I are located below and above the active layer 10I, respectively, in a direction away from the substrate 60I. An equivalent source region 1051I in communication with the source region 101I and an equivalent drain region 1052I in communication with the drain region 102I are formed in the channel region 103I.

When the device is on by applying a bias voltage to the gate electrode 20I of the device, the gate electrode 20I controls the formation of a channel 104I connecting the source region 101I and the drain region 102I in the channel region 103I of the device. However, only the portion of the channel 104I which the vertical projection on the channel region 103I does not overlap with the equivalent source region 1051I and the equivalent drain region 1052I constitutes an effective channel 1041I for transferring the working current when the device is on, i.e. the remaining portion 1042I in the channel 104I is not used for transferring the working current when the device is on.

In each of the above-mentioned embodiments, the source region and the drain region of the device may be a common heavily doped semiconductor source/drain, and may also be a Schottky metal source/drain of a metal-semiconductor structure; the gate electrode may be a common metal-insulating layer-semiconductor MOS structure, and may also be a Schottky junction gate electrode of a metal semiconductor structure; the active layer may be composed of a single semiconductor material or may also include at least two semiconductor materials varying in the direction of thickness or planar extension to form a composite channel.

In addition, the equivalent source region and the equivalent drain region may be formed spontaneously or may be controllably formed by the gate electrode with a corresponding structure.

Figure 19:
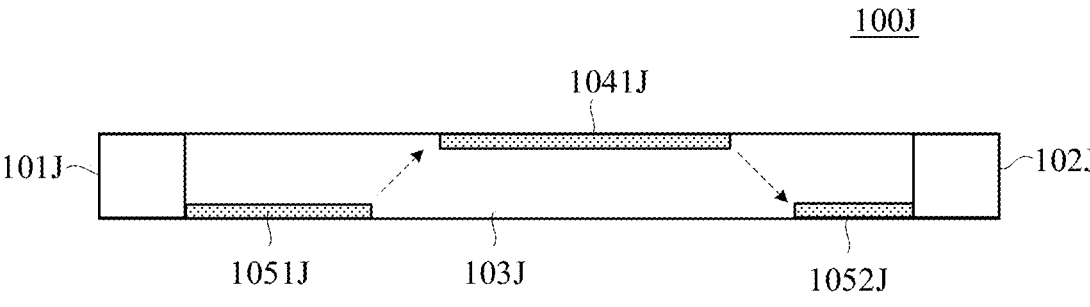
FIG. 19 is a schematic structural view of an effective channel and a conductive region having a spacing between vertical projections on the channel region of an equivalent source and drain region optimized field-effect transistor device of an embodiment of the present invention.

In general, in the embodiments described above, the vertical projection of the effective channel, the equivalent source region and/or the equivalent drain region superimposed on the channel region communicates the source region and the drain region, thereby ensuring that the carriers of the effective channel and the equivalent source region and/or the equivalent drain region may be injected unidirectionally or bidirectionally at least in the thickness direction and constructing a carrier path from the source region to the drain region. Of course, referring to FIG. 19, the present invention does not exclude that in some particular embodiments, if the vertical projection of the effective channel, the equivalent source region and the equivalent drain region superimposed on the channel region 103J is not able to communicate the source region 101J and the drain region 102J of the device 100J, but has an "appropriate spacing", the spacing is not able to completely cut off the path of the carriers flowing from the equivalent source region 1051J to the effective channel 1041J and from the effective channel 1041J to the equivalent drain region 1052J, the injection direction of the carriers between the effective channel 1041J, the equivalent source region 1051J and the equivalent drain region 1052J is at an angle to the thickness direction of the channel region 103J, and such an embodiment should also fall within the scope of protection of the present invention.

The following are the results of Silvaco TCAD simulation verification using the SOI device applying the above embodiments of the present invention.

Simulation Example 1

In the simulation example 1, the SOI device to which the above-described embodiments of the present invention are applied is referred to as "SOI device of the present invention". As a comparison, the SOI device has a similar structure to the SOI device of the present invention, and the difference only lies in that the lengths of the equivalent source region and the equivalent drain region in the SOI device as a comparison (referred to as a comparative SOI device in the present simulation example) are equal.

Simulation parameters: the source and drain are N-type doped. The doping concentration is 1E21 cm$^{-3}$, the channel is P-type doped. The doping concentration is 1E17 cm$^{-3}$, the channel length $L_g$ is 130 nm, the effective channel length $L_{eff}$ is 70 nm, the sum of the lengths of the equivalent source region $L_{es}$ and the equivalent drain region $L_{ed}$ is 60 nm (wherein the equivalent source region length is 10 nm, 30 nm, 35 nm and 50 nm, and when the equivalent source region length is 30 nm, it is a SOI device as a comparison), the thickness of the active layer is 50 nm, the thickness of the gate insulating layer is 5 nm, the fixed surface charge density at the interface where the equivalent source region and the equivalent drain region are formed is 1E14 cm$^{-2}$, and the drain voltage $V_d$=2 V or 0.1 V.

Figure 20:
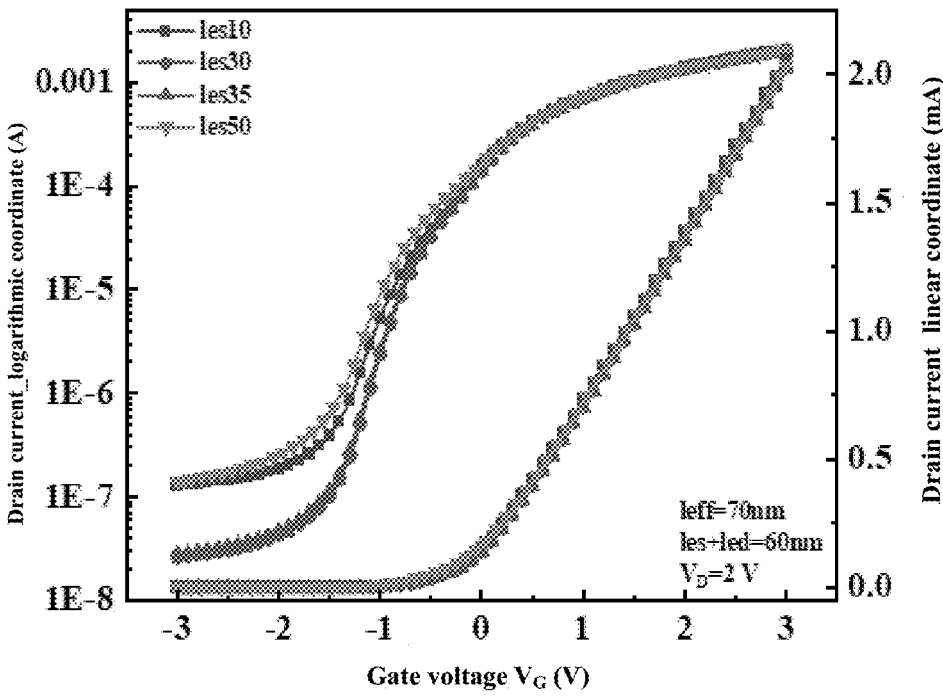
FIGS. 20 to 21 are comparison views of the transfer characteristics of the SOI device of the present invention and the comparative SOI device in simulation example 1.
Figure 21:
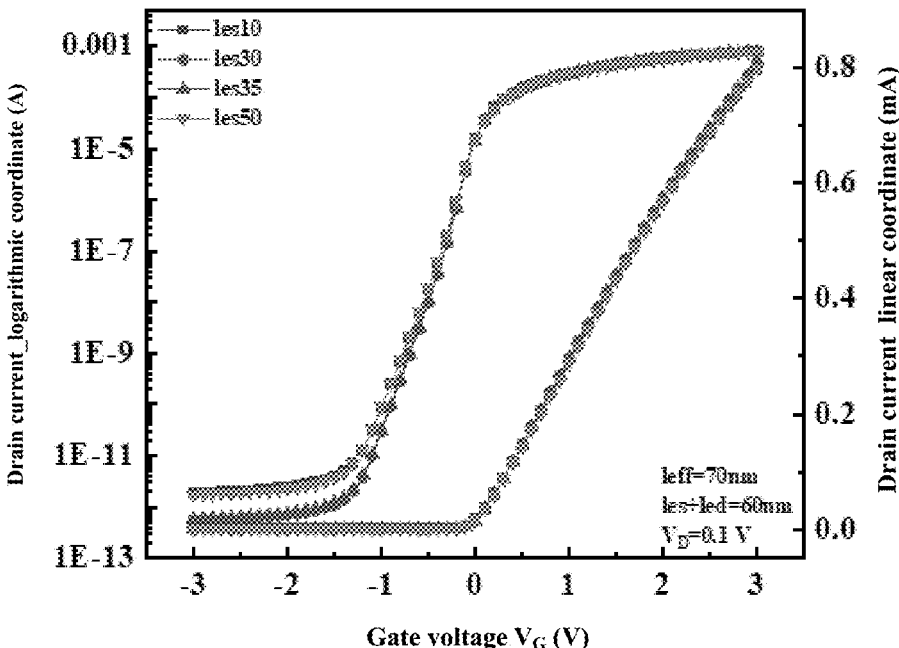

Referring to FIGS. 20 and 21, FIGS. 20 and 21 are comparison diagrams of the transfer characteristics of the SOI device of the present invention and the comparative SOI device when the drain voltage $V_d$ is 2 V and 0.1 V, respectively. It may be seen that the subthreshold swing of the comparative SOI device is the smallest, while in the SOI device of the present invention, the closer the equivalent source region length is to 30 nm, the smaller the subthreshold swing is. Taking the SOI device of the present invention with the equivalent source region length is 35 nm as an example, the subthreshold swing loss is very small when the drain voltage $V_d$ is 2 V and 0.1 V.

Figure 22:
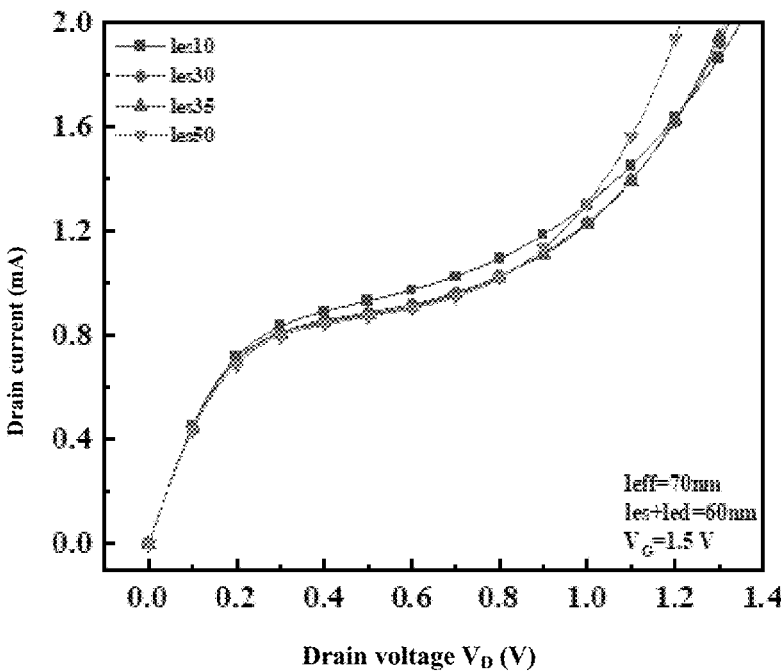
FIGS. 22 to 23 are comparison views of the output characteristics of the SOI device of the present invention and the comparative SOI device in simulation example 1.
Figure 23:
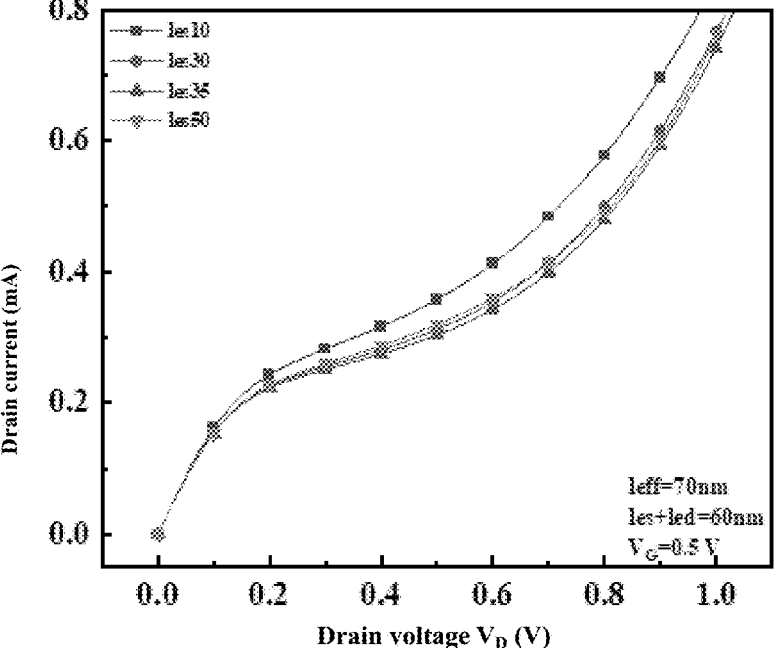

Referring to FIGS. 22 and 23, FIGS. 22 to 23 are comparison diagrams of the output characteristics of the SOI device of the present invention and the comparative SOI device when the gate voltage $V_g$ is 1.5 V and 0.5 V. The $V_d$ value corresponding to the significant occurrence of KINK current in the output characteristics is $V_{kink}$, and the greater the $V_{kink}$ is, the weaker the carrier impact ionization effect in the drain terminal depletion region of the device is, and the more difficult the kink current effect is to occur in the device. It may be seen that the saturated voltage $V_{dsat}$ and saturated current $I_{dsat}$ losses of the SOI device of the present invention are small, but the kink voltage $V_{kink}$ and output impedance $R_o$ are significantly improved.

As may be seen from a comparison of FIGS. 20-23, the SOI device of the present invention may significantly improve the output characteristics of the device without significant loss in short-channel effects suppression ability over the comparative SOI device.

Simulation Example 2

In the simulation example 2, it will be verified in the SOI device (referred to as the SOI device of the present invention in the present simulation example) to which the above embodiments of the present invention are applied that: the influence on the device when the work function $W_{L_{eff}}$ of a portion of the first gate electrode corresponding to the effective channel, the work function $W_{L_{es}}$ of a portion of the rest portion of the first gate electrode adjacent to the source region, and the work function $W_{L_{ed}}$ of a portion of the rest portion of the first gate electrode adjacent to the drain region change. As a comparison, the SOI device has a similar structure to the SOI device of the present invention (referred to as a comparative SOI device in the present simulation example), and the difference only lies in not having the above-mentioned structural change.

Simulation parameters: the source and drain is N-type doped, and the doping concentration is 1E21 cm$^{-3}$, the channel is P-type doped and doping is a P-type, the doping concentration is 1E17 cm$^{-3}$, the channel length $L_g$ is 130 nm, the effective channel length $L_{eff}$ is 70 nm, the lengths of the equivalent source region $L_{es}$ and the equivalent drain region $L_{ed}$ are both 30 nm, the thickness of the active layer is 50 nm, the thickness of the gate insulating layer is 5 nm, the fixed surface charge density at the interface where the equivalent source region and the equivalent drain region are formed is 1E14 cm$^{-2}$, and the drain voltage $V_d$=2 V or 0.1 V.

Figure 24:
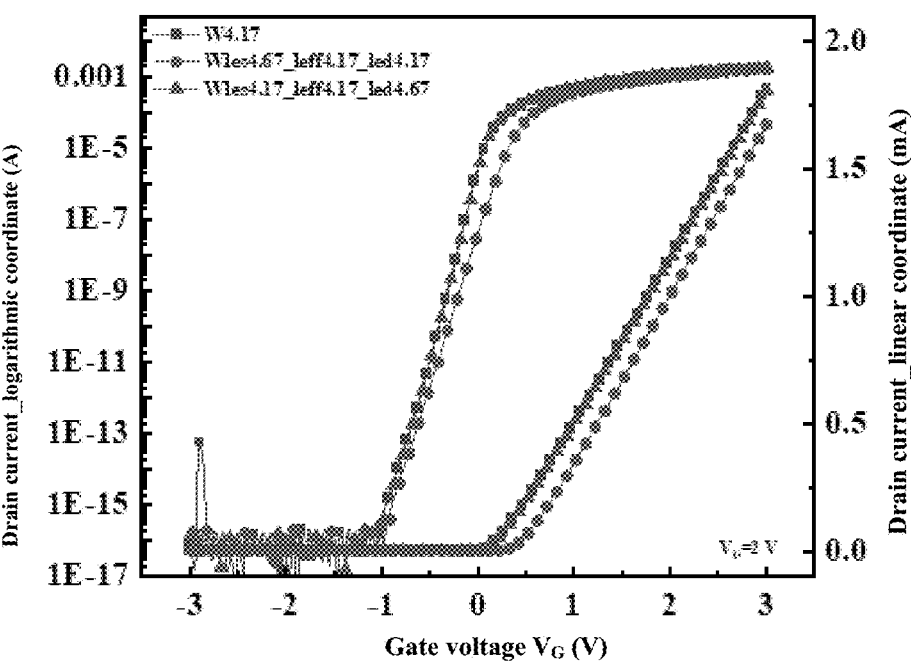
FIGS. 24 to 39 are comparison diagrams of respective transfer characteristics and output characteristics of the SOI device of the present invention and the comparative SOI device in simulation example 2.
Figure 25:
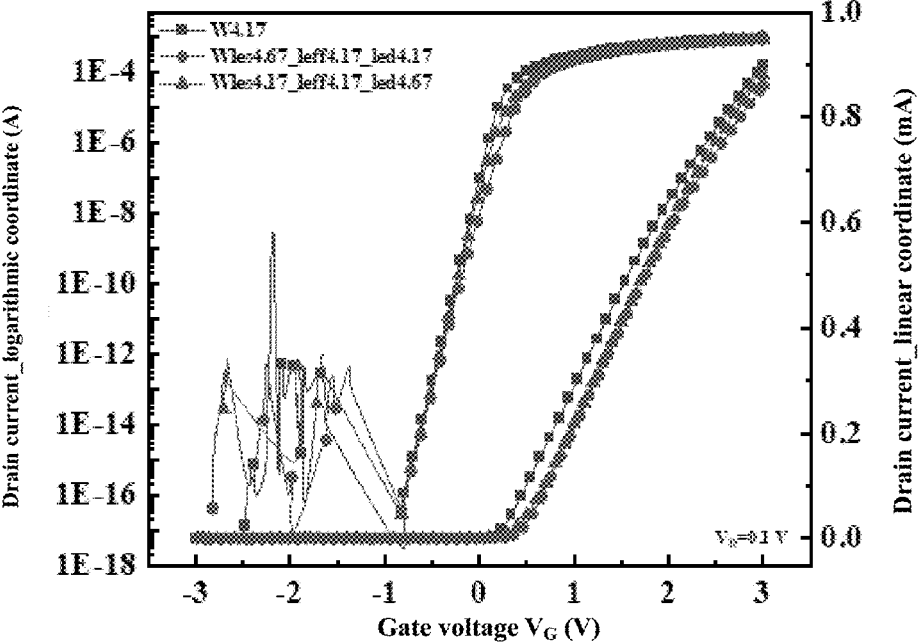
Figure 26:
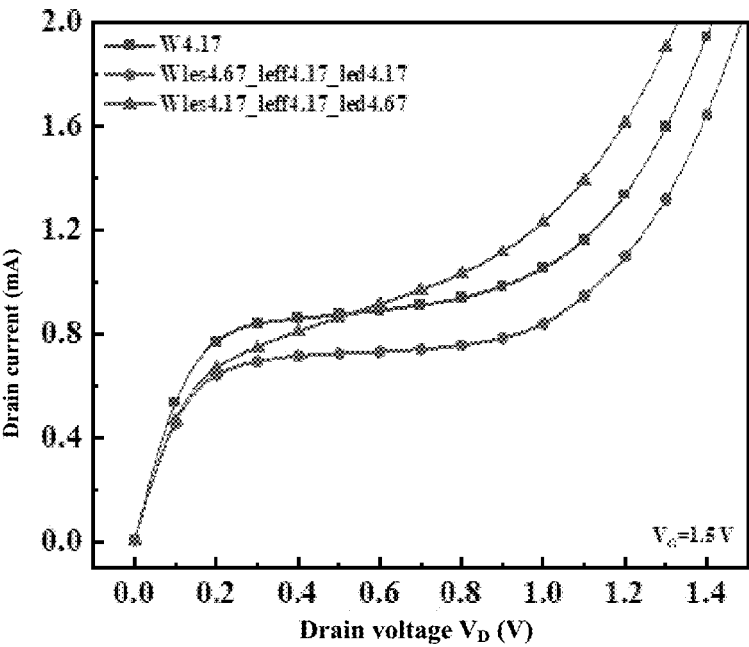
Figure 27:
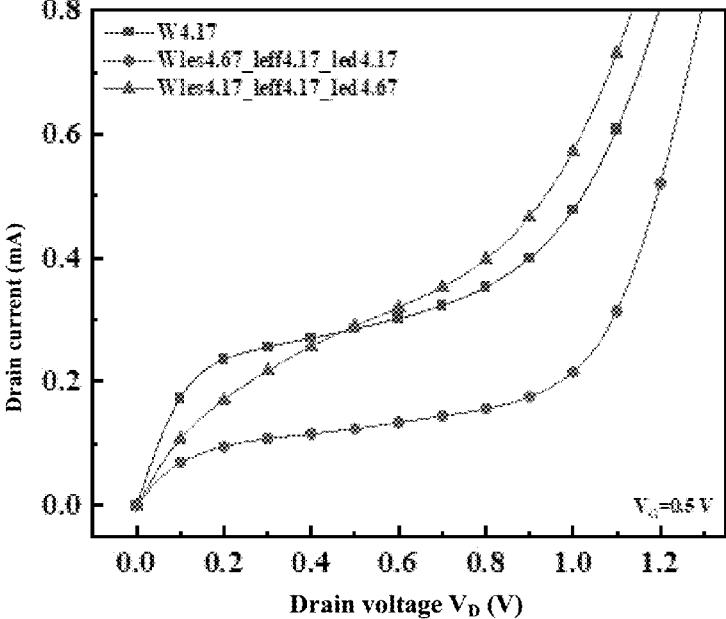

Referring to FIGS. 24 and 25, FIGS. 24 and 25 are comparison diagrams of transfer characteristics of the SOI device of the present invention and the comparative SOI device with two different first gate electrode work functions when the drain voltage $V_d$ is 2 V and 0.1 V, respectively; and FIGS. 26 and 27 are comparison diagrams of the output characteristics of the SOI device of the present invention and the comparative SOI device with two different first gate electrode work functions when the gate voltage $V_g$ is 1.5 V and 0.5 V, respectively. Wherein the first gate electrode work function W of the comparative SOI device is 4.17 eV, and the two SOI devices of the present invention respectively improve $W_{L_{es}}$ to 4.67 eV and $W_{L_{ed}}$ to 4.67 e V on the basis of the comparative SOI device.

As may be seen from FIGS. 24 and 25, with respect to the comparative SOI device, when $W_{L_{es}}$ is improved, the sub-threshold swing characteristic of the SOI device of the present invention becomes worse, namely, the short-channel effects suppression ability becomes weaker; when $W_{L_{ed}}$ is improved, the subthreshold swing of the SOI device of the present invention is hardly affected. Meanwhile, as may be seen from FIGS. 26 and 27, with respect to the comparative SOI device, the output characteristics of the SOI device of the present invention are deteriorated regardless of improvement of $W_{L_{es}}$ or improvement of $W_{L_{ed}}$.

Figure 28:
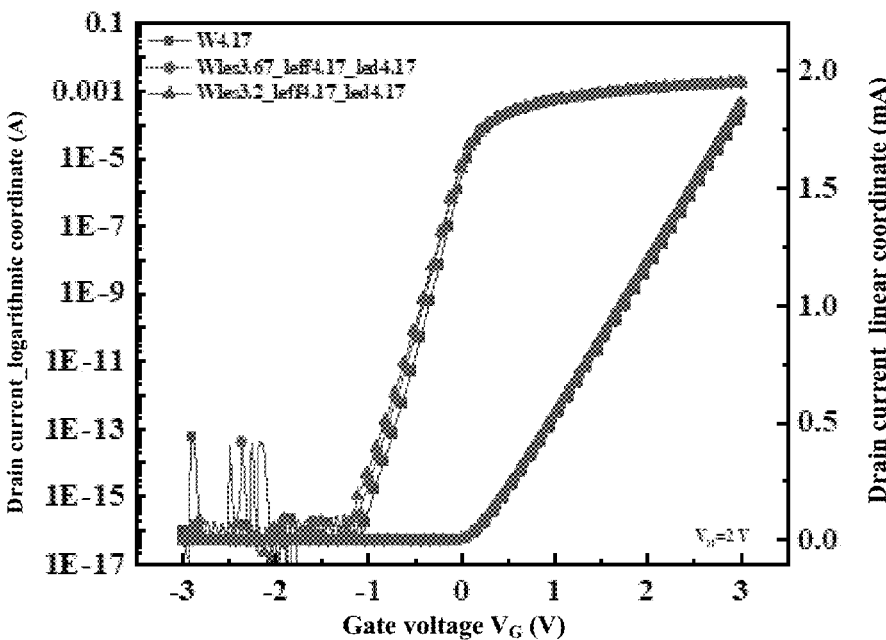
Figure 29:
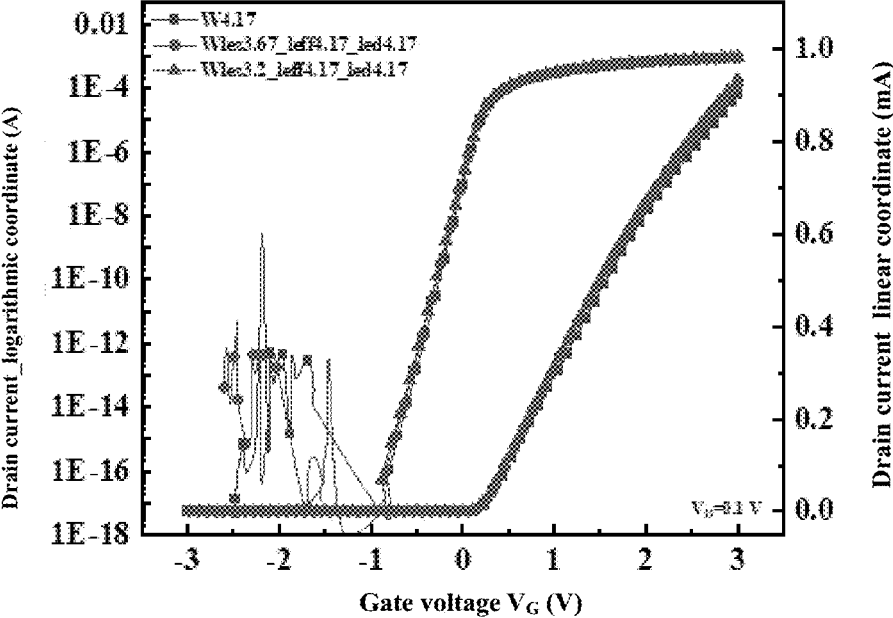
Figures 30, 31:
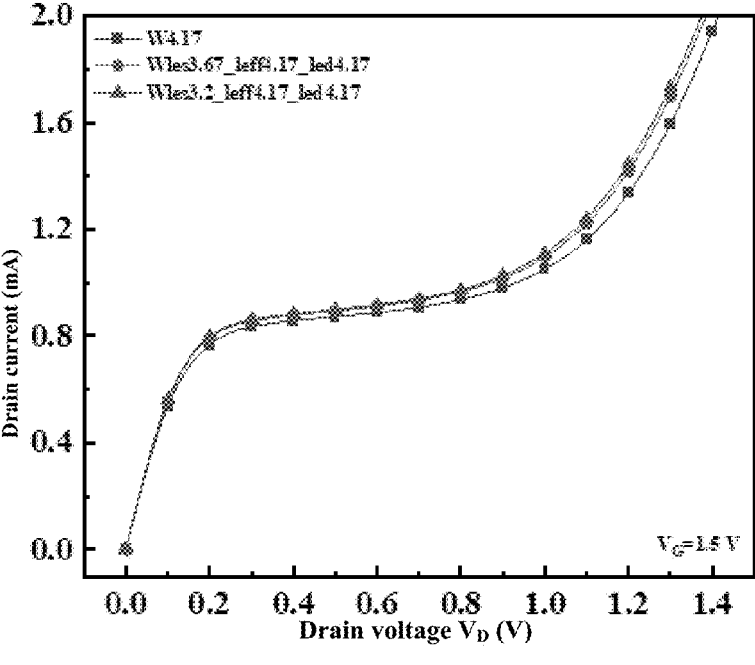

Referring to FIGS. 28 and 29, FIGS. 28 and 29 are comparison diagrams of the transfer characteristics of the SOI device of the present invention and the comparative SOI device with two different first gate electrode work functions when the drain voltage $V_d$ is 2 V and 0.1 V, respectively; and FIGS. 30 and 31 are comparison diagrams of the output characteristics of the SOI device of the present invention and the comparative SOI device with two different first gate electrode work functions when the gate voltage $V_g$ is 1.5 V and 0.5 V, respectively. Wherein the first gate electrode work function W of the comparative SOI device is 4.17 eV, and the two SOI devices of the present invention respectively decrease $W_{L_{es}}$ to 3.67 eV and 3.2 eV on the basis of the comparative SOI device.

As may be seen from FIGS. 28 and 29, with respect to the comparative SOI device, when $W_{L_{es}}$ is decreased, the sub-threshold swing characteristic of the SOI device of the present invention becomes slightly worse, namely, the short-channel effects suppression ability becomes slightly weaker. Hhowever, as may be seen from FIGS. 30 and 31, when $W_{L_{es}}$ is decreased, the saturated voltage $V_{dsat}$ and saturated current $I_{dsat}$ of the SOI device of the present invention are significantly improved. That is to say, when $W_{L_{es}}$ is decreased, it is possible to significantly improve the output characteristics of the device without a significant loss in the short-channel effects suppressing ability.

Figure 32:
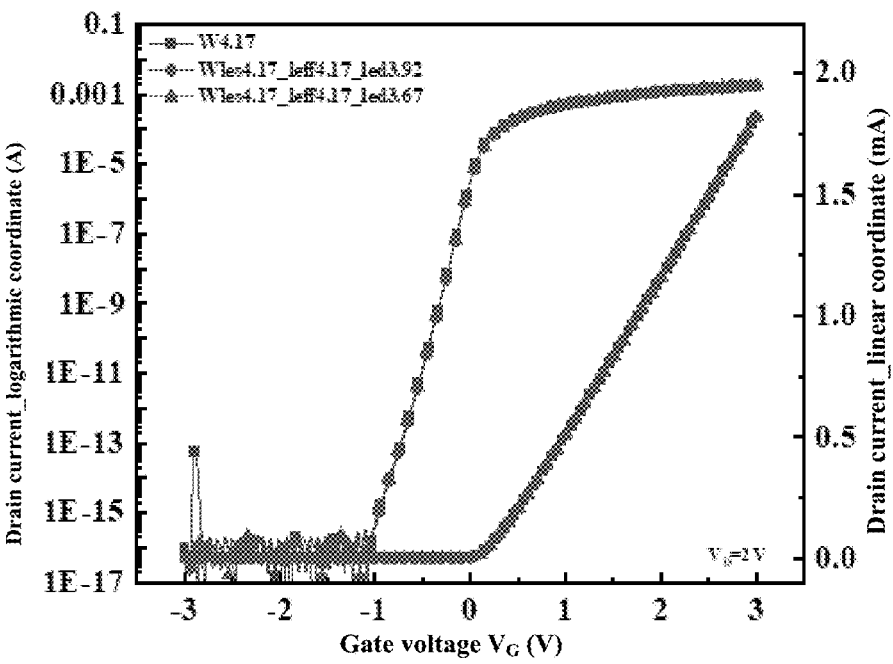
Figure 33:
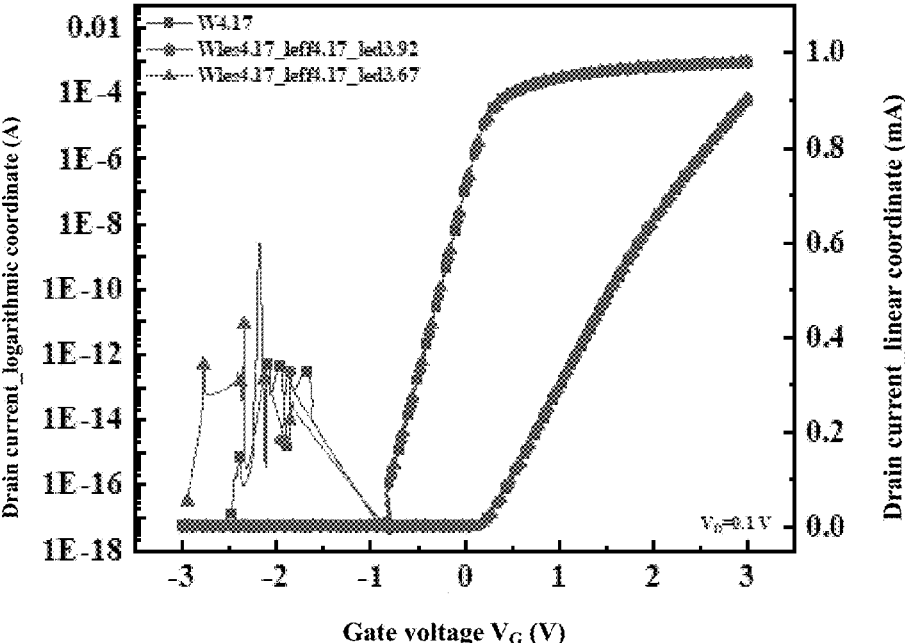
Figure 34:
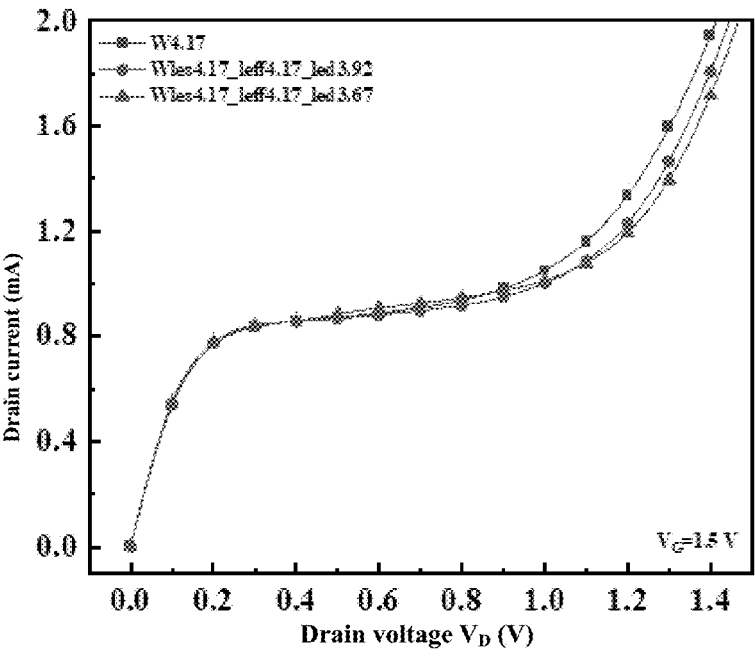
Figure 35:
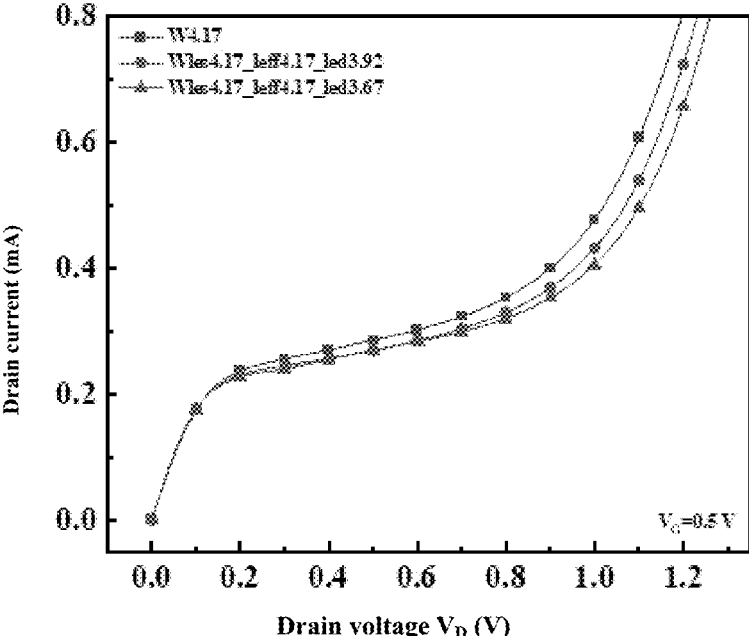

Referring to FIGS. 32 and 33, FIGS. 32 and 33 are comparison diagrams of the transfer characteristics of the SOI device of the present invention and the comparative SOI device with two different first gate electrode work functions when the drain voltage $V_d$ is 2 V and 0.1 V, respectively; and FIGS. 34 and 35 are comparison diagrams of the output characteristics of the SOI device of the present invention and the comparative SOI device with two different first gate electorde work functions when the gate voltage $V_g$ is 1.5 V and 0.5 V, respectively. Wherein the first gate electrode work function W of the comparative SOI device is 4.17 eV, and the two SOI devices of the present invention respectively decrease $W_{L_{ed}}$ to 3.92 eV and 3.67 eV on the basis of the comparative SOI device.

As may be seen from FIGS. 32 and 33, with respect to the comparative SOI device, when $W_{L_{ed}}$ is decreased, the sub-threshold swing characteristic of the SOI device of the present invention is substantially unchanged, namely, the short-channel effects suppression ability is substantially unchanged; however, as may be seen from FIGS. 34 and 35, when $W_{L_{ed}}$ is decreased, the kink voltage of the SOI device of the present invention significantly increases. That is to say, when $W_{L_{ed}}$ is decreased, it is possible to significantly improve the output characteristics of the device while keeping the short-channel effects suppressing ability substantially unchanged.

Figure 36:
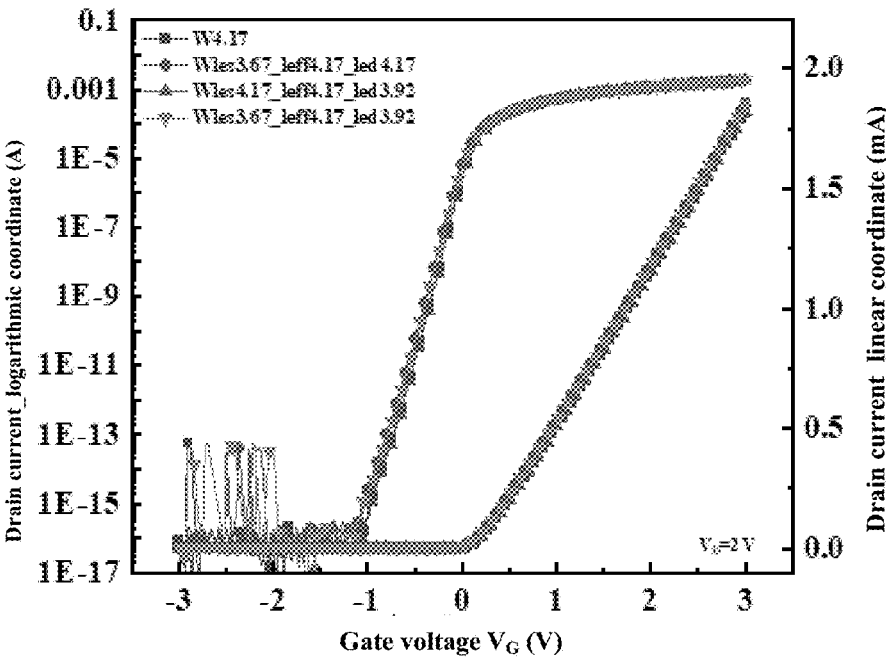
Figure 37:
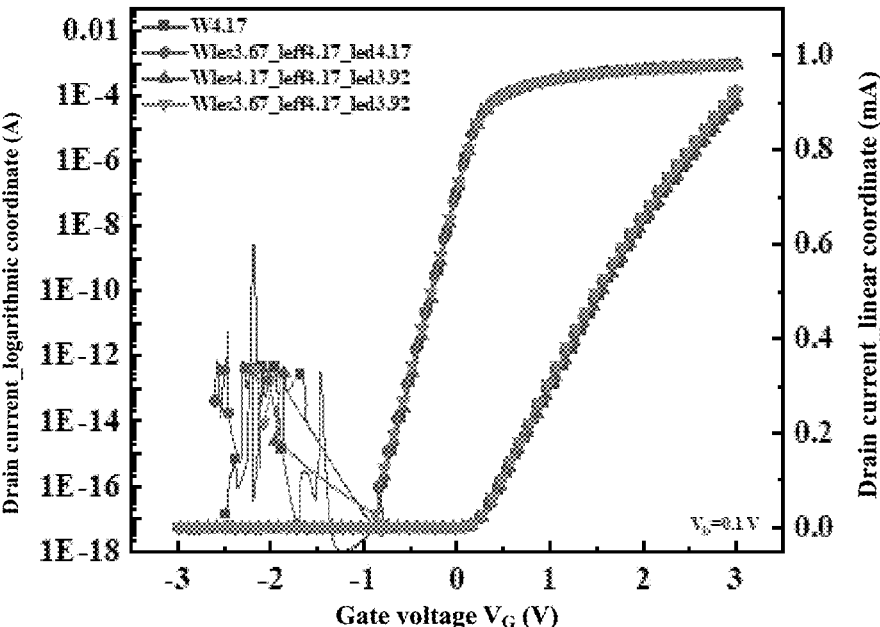
Figure 38:
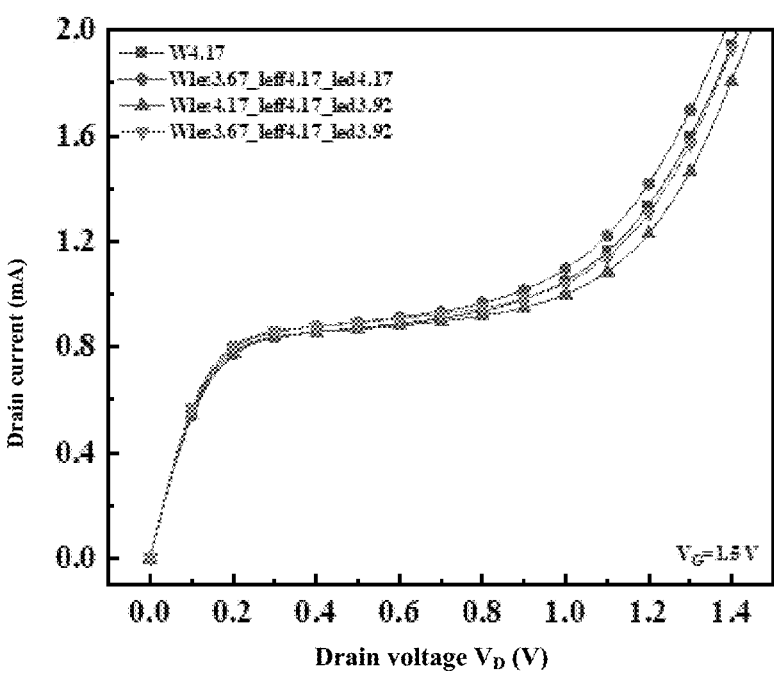
Figure 39:
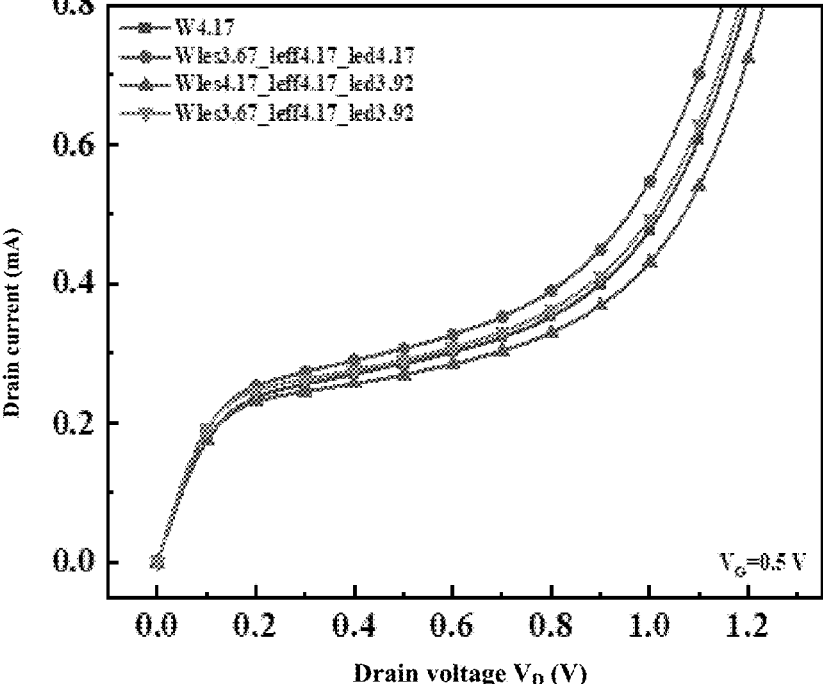

Referring to FIGS. 36 and 37, FIGS. 36 and 37 are comparison diagrams of the transfer characteristics of the SOI device of the present invention and the comparative SOI device with three different first gate electrode work functions when the drain voltage $V_d$ is 2 V and 0.1 V, respectively; and FIGS. 38 and 39 are comparison diagrams of the output characteristics of the SOI device of the present invention and the comparative SOI device with three different first gate electrode work functions when the gate voltage $V_g$ is 1.5 V and 0.5 V, respectively. Wherein the first gate electrode work function W of the comparative SOI device is 4.17 eV, and the three SOI devices of the present invention respectively decrease $W_{L_{es}}$ to 3.67 eV, decrease $W_{L_{ed}}$ to 3.92 eV, meanwhile decrease $W_{L_{es}}$ to 3.67 eV and decrease $W_{L_{ed}}$ to 3.92 eV on the basis of the comparative SOI device.

As may be seen from FIGS. 36-39, with respect to the comparative SOI device, the SOI device of the present invention simultaneously decreasing $W_{L_{es}}$ and $W_{L_{ed}}$ may not only ensure a good suppression ability for short-channel effects, but also enable the device to have a smaller saturated voltage $V_{dsat}$, and a larger saturated current $I_{dsat}$, a kink voltage $V_{kink}$ and an output impedance $R_o$.

It should be understood that, although the terms "first, second, etc." may be used herein to describe various elements or structures, these described objects should not be limited by these terms. These terms are only used to distinguish one descriptive object from another. For example, a first channel may be referred to as a second channel, and similarly a second channel may be referred to as a first channel, without departing from the scope of the present invention.

In addition, the same reference numbers or designations may be used in different embodiments, but are not intended to represent structural or functional relationships, merely for convenience of description.

As used herein, terms such as "upper", "above", "lower", "below", and the like, indicating relative locations in space, are used for descriptive purposes to describe one element or feature's relationship to another element or feature as illustrated in the figures. The term for relative locations in space may be intended to include different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" may encompass both an orientation of above and below. The device may be otherwise oriented (rotated 90 degrees or other orientations) and the spatially relative descriptors used herein interpreted correspondingly.

When an element or layer is referred to as being "on", "connected" to another component or layer, it may be directly on, connected to another component or layer, or intervening elements or layers may be present. In contrast, when a component is referred to as being "directly on" or "directly connected to" another component or layer, there are no intervening components or layers present.

It will be evident to those skilled in the art that the invention is not limited to the details of the foregoing exemplary embodiments, and that the present invention may be embodied in other specific forms without departing from the spirit or essential characteristics thereof. The present embodiments are therefore to be considered in all respects as exemplary and not restrictive, the scope of the invention being indicated by the appended claims rather than by the foregoing description, and all changes which come within the meaning and range of equivalency of the claims are therefore intended to be embraced therein. Any reference numerals in a claim should not be construed as limiting the claim concerned.

In addition, it should be understood that while the specification has been described in terms of embodiments, not every embodiment includes an independent technical solution, and that the specification is described in this way only for the sake of clarity and that those skilled in the art will recognize that the specification as a whole may be appropriately combined to form other embodiments as will be appreciated by those skilled in the art.

What is claimed is:

1. A field-effect transistor device with equivalent source and drain region optimization, comprising an active layer, the active layer including a source region, a drain region and a channel region located between the source region and drain region;

wherein when the device is in an on-state, an effective channel as well as an equivalent source region and an equivalent drain region away from the effective channel, are formed in the channel region at least in a thickness direction of the channel region;

wherein the source region and the drain region are connected and communicated via the effective channel and the equivalent source region and the equivalent drain region, to contribute a working current; and wherein a length of the equivalent source region is greater than a length of the equivalent drain region.

2. The field-effect transistor device according to claim 1, wherein the equivalent source region comprises a first conductive region located in the channel region and in communication with the source region; and wherein the equivalent drain region comprises a second conductive region located in the channel region and in communication with the drain region, the first conductive region and the second conductive region having a spacing therebetween.

3. The field-effect transistor device according to claim 2, comprising a first gate electrode arranged on one side surface of the active layer, the first gate electrode overlapping a vertical projection of the first conductive region and the second conductive region on the channel region;

wherein the first gate electrode is capable of controlling the channel region and forming a channel therein, and a portion of the channel which does not overlap the vertical projection of the first conductive region and the second conductive region on the channel region constitutes the effective channel.

4. The field-effect transistor device according to claim 3, wherein when the device is in an on-state, a conductance of the first conductive region and the second conductive region is greater than a conductance of a rest portion of the channel except for the effective channel, so that the first conductive region is capable of injecting carriers into the effective channel and the effective channel is capable of injecting carriers into the second conductive region; preferably, the conductance of the first conductive region and the second conductive region is at least three times greater than the conductance of the rest portion of the channel except for the effective channel.

5. The field-effect transistor device according to claim 3, wherein when the device is in an on-state, a conductance per unit length of the effective channel in the channel is less than a conductance per unit length of a rest portion of the channel except for the effective channel.

6. The field-effect transistor device according to claim 3, wherein when the field-effect transistor device is an N-type device, a work function of a portion of the first gate electrode corresponding to the effective channel is greater than a work function of a rest portion of the first gate electrode;

when the field-effect transistor device is a P-type device, a work function of a portion of the first gate electrode corresponding to the effective channel is less than a work function of the rest portion of the first gate electrode;

the field-effect transistor device comprises a gate insulating layer arranged between the first gate electrode and the channel region, wherein a thickness of a portion of the gate insulating layer corresponding to the effective channel is greater than a thickness of a rest portion of the gate insulating layer; and a dielectric constant of a portion of the gate insulating layer corresponding to the effective channel is greater than a dielectric constant of a rest portion of the gate insulating layer.

7. The field-effect transistor device according to claim 6, wherein when the field-effect transistor device is an N-type device, it satisfies:

$0.2V < V_{th\_L_{eff}} - V_{th\_L_{ed}} \leq 0.7V$;

when the field-effect transistor device is a P-type device, it satisfies:

$0.2V < V_{th\_L_{ed}} - V_{th\_L_{eff}} \leq 0.7V$;

wherein $V_{th\_L_{eff}}$ is a threshold voltage of a portion of the first gate electrode corresponding to the effective channel, and $V_{th\_L_{ed}}$ is a threshold voltage of a portion of the first gate electrode corresponding to the equivalent drain region.

8. The field-effect transistor device according to claim 2, further comprising a second gate electrode arranged on one side surface of the active layer adjacent to the first conductive region and the second conductive region, wherein the second gate electrode controls the formation of the first conductive region and the second conductive region in the channel region; and the first conductive region and the second conductive region are formed by carriers introduced by surface doping on one side surface of the channel region away from the effective channel.

9. The field-effect transistor device according to claim 2, further comprising an insulating layer arranged on one side surface of the active layer away from the effective channel, wherein the first conductive region and second conductive region are composed of carriers generated by injecting charges in the insulating layer at a location adjacent to the insulating layer in the channel region through electrostatic induction.

10. The field-effect transistor device according to claim 2, further comprising a semiconductor material layer arranged on one side surface of the active layer away from the effective channel, wherein the active layer and the semiconductor material layer form a heterostructure, and the first conductive region and the second conductive region are composed of a two-dimensional electron gas channel or a two-dimensional hole gas channel distributed in the heterostructure.

11. The field-effect transistor device according to claim 2, further comprising a semiconductor material layer arranged on one side surface of the active layer away from the effective channel, wherein the first conductive region and the second conductive region are composed of a two-dimensional electron gas channel or a two-dimensional hole gas channel formed by surface treatment on one side surface of the channel region away from the effective channel.

12. The field-effect transistor device according to claim 1, wherein a length ratio of the equivalent source region to the equivalent drain region ranges from 1.1:1 to 2.5:1; and the sum of the lengths of the equivalent source region and the equivalent drain region is no greater than three times that of the effective channel.

13. The field-effect transistor device according to claim 1, wherein the source region and the drain region are a doped semiconductor or a Schottky metal source/drain; and/or, a gate electrode of the field-effect transistor device is a metal-insulating layer-semiconductor MOS structure gate electrode or a Schottky junction gate electrode; and the active layer comprises at least two semiconductor materials varying along a thickness direction or a planar extension direction thereof; and the field-effect transistor device is a planar structure device or a vertical structure device.

\*  \*  \*  \*  \*